United States Patent
Nakashima et al.

(10) Patent No.: US 12,280,550 B2
(45) Date of Patent: Apr. 22, 2025

(54) METHODS FOR MANUFACTURING THERMOPLASTIC LIQUID CRYSTAL POLYMER FILM AND CIRCUIT BOARD

(71) Applicant: KURARAY CO., LTD., Kurashiki (JP)

(72) Inventors: Takahiro Nakashima, Kamisu (JP); Minoru Onodera, Kurashiki (JP); Tatsuya Sunamoto, Chiyoda-ku (JP)

(73) Assignee: KURARAY CO., LTD., Kurashiki (JP)

( * ) Notice: Subject to any disclaimer, the term of this patent is extended or adjusted under 35 U.S.C. 154(b) by 494 days.

(21) Appl. No.: 17/349,008

(22) Filed: Jun. 16, 2021

(65) Prior Publication Data

US 2022/0105689 A1    Apr. 7, 2022

Related U.S. Application Data

(60) Division of application No. 15/137,343, filed on Apr. 25, 2016, now abandoned, which is a continuation of
(Continued)

(30) Foreign Application Priority Data

Nov. 1, 2013    (JP) .................................. 2013-228087

(51) Int. Cl.
*B29C 65/02* (2006.01)
*B29C 65/00* (2006.01)
(Continued)

(52) U.S. Cl.
CPC ........ *B29C 65/02* (2013.01); *B29C 66/00145* (2013.01); *B29C 66/028* (2013.01);
(Continued)

(58) Field of Classification Search
None
See application file for complete search history.

(56) References Cited

U.S. PATENT DOCUMENTS 4,997,507 A    3/1991 Meyer
5,235,008 A *  8/1993 Hefner, Jr. ............ C08F 290/14
                                                    525/922
(Continued)

FOREIGN PATENT DOCUMENTS

CN    102294861 A    12/2011
JP    8-97565          4/1996
(Continued)

OTHER PUBLICATIONS

Machine translation JP2008-103559.*
(Continued)

*Primary Examiner* — Christopher T Schatz
(74) *Attorney, Agent, or Firm* — Oblon, McClelland, Maier & Neustadt, L.L.P.

(57) ABSTRACT

A method producing thermoplastic liquid crystal polymer (TLCP) film(s) may include (i) preparing a TLCP film (adherend film) and a TLCP film (adhesive film); (ii) examining each TLCP film for relative intensity calculated as a ratio in percentage of a sum of peak areas of C—O bond peak and COO bond peak based on the total area of C1s peaks in the X-ray photoelectron spectroscopy (XPS) profile to calculate relative intensity X (%) for the adherend film and relative intensity Y (%) for the adhesive film; and (iii) controlling the TLCP film adhesive film to have a relative intensity Y by selection or activation treatment of the adhesive film so that the relative intensity X of the adherend film and the relative intensity Y of the adhesive film satisfy $38 \leq X+Y \leq 65$    (1), and $-8.0 \leq Y-X \leq 8.0$    (2).

11 Claims, 3 Drawing Sheets

Related U.S. Application Data application No. PCT/JP2014/078063, filed on Oct. 22, 2014.

(51) Int. Cl.
| | |
|---|---|
| *B32B 7/02* | (2019.01) |
| *B32B 7/025* | (2019.01) |
| *B32B 7/027* | (2019.01) |
| *B32B 7/12* | (2006.01) |
| *B32B 27/08* | (2006.01) |
| *C08J 5/12* | (2006.01) |
| *C09J 5/06* | (2006.01) |
| *H05K 1/03* | (2006.01) |
| *H05K 3/46* | (2006.01) |
| *B29C 65/48* | (2006.01) |
| *B29C 65/50* | (2006.01) |
| *B29K 105/00* | (2006.01) |
| *B29L 31/34* | (2006.01) |

(52) U.S. Cl.
CPC .............. *B29C 66/73* (2013.01); *B32B 7/02* (2013.01); *B32B 7/025* (2019.01); *B32B 7/027* (2019.01); *B32B 7/12* (2013.01); *B32B 27/08* (2013.01); *C08J 5/121* (2013.01); *C09J 5/06* (2013.01); *H05K 1/032* (2013.01); *H05K 3/4644* (2013.01); *B29C 65/4815* (2013.01); *B29C 65/5057* (2013.01); *B29C 66/0242* (2013.01); *B29C 66/1122* (2013.01); *B29C 66/45* (2013.01); *B29C 66/73111* (2013.01); *B29C 66/73115* (2013.01); *B29C 66/73921* (2013.01); *B29K 2105/0079* (2013.01); *B29L 2031/3425* (2013.01); *B32B 2307/206* (2013.01); *B32B 2457/202* (2013.01); *C08J 2300/12* (2013.01); *C08J 2367/00* (2013.01); *C08J 2467/00* (2013.01); *C09J 2203/326* (2013.01); *C09J 2301/312* (2020.08); *C09J 2467/00* (2013.01); *C09J 2467/006* (2013.01); *H05K 2201/0141* (2013.01)

(56) References Cited

U.S. PATENT DOCUMENTS

| | | | |
|---|---|---|---|
| 5,719,354 | A | 2/1998 | Jester et al. |
| 8,623,449 | B2 | 1/2014 | Ito et al. |
| 8,771,458 | B2 | 7/2014 | Onodera et al. |
| 2009/0065240 | A1 | 3/2009 | Onodera et al. |
| 2011/0157774 | A1* | 6/2011 | Aitchison ............... H01G 9/14 361/517 |
| 2011/0315438 | A1 | 12/2011 | Ito et al. |

FOREIGN PATENT DOCUMENTS

| | | | |
|---|---|---|---|
| JP | 11-309803 | 11/1999 | |
| JP | 2000-286537 | 10/2000 | |
| JP | 2007-131724 | 5/2007 | |
| JP | 2007-302740 | 11/2007 | |
| JP | 2008-103559 | 5/2008 | |
| JP | 2008-103559 A | 5/2008 | |
| JP | 2010-103269 | 5/2010 | |
| WO | WO-03064506 A1 * | 8/2003 | ............ B32B 15/08 |
| WO | 2007/013330 A1 | 2/2007 | |

OTHER PUBLICATIONS

Machine translation of WO0306506.*
International Search Report issued Jan. 20, 2015 in PCT/JP2014/078063, filed Oct. 22, 2014 (with English Translation).
Captive Aire: https://www.captiveaire.com/MANUALS/AIRSYSTEMDESIGN/DESIGNAIRSYSTEMS.HTM (Year: 2000).
Japanese Office Action Issued on Mar. 24, 2020, in Patent Application No. 2019-093713, 10 pages (with unedited computer generated English translation).
Blaine, Roger L. and Waguespack, Louis E., "Determination of Polymer Crystal Molecular Weight Distribution by DSC", TA Instruments, Inc.: http://www.tainstruments.com/pdf/literature/TA276.pdf (Year: 2017).
Office Action issued Mar. 27, 2019 on corresponding Chinese Patent Application No. 201480060003.2 with machine English translation, 8 pp.).
Notification of Reasons for Refusal issued Dec. 4, 2018 on corresponding Japanese patent application No. 2015-544941 w/machine English translation.
Office Action issued Jul. 24, 2018 in Japanese Patent Application No. 2015-544941 (with unedited computer generated English translation), 6 pages.
Office Action issued Jul. 12, 2018 in Chinese Patent Application No. 201480060003.2 (with English language summary). 5 pages.
Combined Office Action and Search Report issued Nov. 1, 2017 in Chinese Patent Application No. 201480060003.2 (with English translation of Search Report).
Office Action issued Nov. 24, 2021 in corresponding Korean Patent Application No. 10-2021-7036266 (with English Translation), 8 pages.

* cited by examiner

METHODS FOR MANUFACTURING THERMOPLASTIC LIQUID CRYSTAL POLYMER FILM AND CIRCUIT BOARD

CROSS REFERENCE TO THE RELATED APPLICATION

This application is a divisional of U.S. patent application Ser. No. 15/137,343 filed Apr. 25, 2016, which is a continuation application, under 35 U.S.C. § 111 (a), of international application No. PCT/JP2014/078063, filed Oct. 22, 2014, which claims priority to Japanese patent application No. 2013-228087 filed Nov. 1, 2013, the entire disclosure of which is herein incorporated by reference as a part of this application.

FIELD OF THE INVENTION

The present invention relates to a method for producing a film of a thermoplastic liquid crystal polymer capable of forming an optically anisotropic melt phase (hereinafter may be referred to as a thermoplastic liquid crystal polymer film, or TLCP film, or simply abbreviated as a liquid crystal polymer film, or LCP film) having an improved thermo-adhesive property, and to a circuit board and a method for producing the same.

BACKGROUND ART

In recent years, there have been remarkable developments in the field of information processing, such as personal computers, as well as in the field communication equipment, such as mobile phones. Such electronics and communication equipment have come to be operated at higher frequencies of gigahertz region. In the high frequency band, however, it is known that the electronics and communication equipment generally have increased in transmission loss.

Circuit boards have been conventionally known as one comprising a wiring substrate in which a conductor circuit is formed on a polyimide film, and a coverlay film bonded on the wiring substrate, the coverlay film comprising a polyimide film and an adhesive layer.

However, such a circuit board sometimes has poor heat resistance, especially poor solder heat resistance, due to adhesive usage. Further, some circuit boards contain residual solvent originated from the adhesive. The presence of the solvent in the circuit boards may cause defects in the circuit boards after multi-layering process, resulting in deterioration of reliability of the circuit boards. Accordingly, a technique for forming a circuit board without using an adhesive has been desired.

On the other hand, TLCP films have attracted attention as substrate materials for forming circuit boards without using an adhesive. The TLCP film, however, contains rigid skin layers on the surfaces, the skin layers generated during extrusion. Where the TLCP films are heat-bonded with each other, the skin layers sometimes interrupt sufficient interlayer adhesion between the TLCP films.

In order to improve adhesive property, for example, Patent Document 1 (JP Laid-open Patent Publication No. 2010-103269) discloses a method for producing a multilayer circuit board including: extruding a thermoplastic liquid crystal polymer capable of forming an optically anisotropic melt phase to form a TLCP film, softening at least one surface of the TLCP film by physical grinding or UV irradiation to render the film surface to have a hardness of 0.01 to 0.1 GPa measured in accordance with the nanoindentation method so as to form an adhesive surface, and counterposing the adhesive surface on a circuit surface of a wiring substrate comprising a conductive circuit on at least one surface of a TLCP film capable of forming an optically anisotropic melt phase and carrying out a thermo-compression bonding of the entire components.

In the meanwhile, Patent Document 2 (JP Laid-open Patent Publication No. 2007-302740) discloses a highly adhesive LCP shaped body characterized in that, the LCP shaped body has a surface to be adhered, the surface having the following values with respect to X-ray photoelectron spectroscopy analysis: where calculating each of the relative peak areas of C—O and COO bond peaks based on the total area of C1s peaks of each functional group in the XPS spectral profile, a sum of relative peak areas of C—O and COO bond peaks is 21% or more, and a peak area ratio of C—O bond peak/COO bond peak is 1.5 or less.

This document describes as follows: where a sum of relative peak areas of C—O and COO bond peaks is 21% or more, destruction of liquid crystal polymer molecules appropriately proceeds on the surface to be adhered in the liquid crystal polymer shaped body, resulting in improvement in initial adhesive property of the film because of enhanced reactivity of the surface; where the peak area ratio of C—O/COO is 1.5 or less, the adhesive property can be kept for a long time so as to enhance long-term reliability.

SUMMARY OF THE INVENTION

Patent Document 1 achieves the enhanced interlayer adhesion between liquid crystal polymer films by carrying out the softening treatment of the skin layers by physical grinding or UV irradiation. Patent Document 1, however, fails to disclose or suggest improvement in interlayer adhesion between liquid crystal polymer films without causing damage to the skin layer.

Patent Document 2 essentially requires for LCP films, which generally have difficulty in thermo-adhesion, to have the specific state that a sum of relative peak areas of C—O and COO bond peaks based on the total area of C1s peaks is 21% or more, and a peak area ratio of C—O bond peak/COO bond peak is 1.5 or less in view of breakage of LCP molecules on the film surface. In the Patent Document 2, films that do not satisfy the above state cannot improve adhesive property.

An object of the present invention is to provide a method for producing a liquid crystal polymer film making it possible to improve interlayer adhesion between the films by controlling the film to have a specific relationship with an adherend body.

Another object of the present invention is to provide a circuit board having an improved interlayer adhesion and a method producing the same.

Based on the result of intensive studies to achieve the above objects, the inventors of the present invention have found the following aspects of the present invention.

That is, a first aspect of the present invention relates to a method for producing a TLCP film as an adhesive film to be thermo-bonded to an adherend body of a TLCP film (hereinafter referred to as an adherend film), the method at least including:
  preparing a TLCP film as the adherend film and a TLCP film as the adhesive film;
  examining each of the prepared TLCP films for a relative intensity calculated as a ratio in percentage of a sum of peak areas of C—O bond peak and COO bond peak based on the total area of C1s peaks in the XPS spectral profile so as to calculate a relative intensity X (%) as for the prepared adherend film and a relative intensity Y (%) as for the prepared adhesive film; and controlling the TLCP film as the adhesive film to have a relative intensity Y by selection or activation treatment of the adhesive film so that the relative intensity X of the adherend film and the relative intensity Y of the controlled adhesive film satisfy the following formulae (1) and (2):

$$38 \leq X+Y \leq 65 \quad (1)$$

$$-8.0 \leq Y-X \leq 8.0 \quad (2).$$

In the above method, the controlling process may be performed by at least one activation treatment selected from the group consisting of ultraviolet (UV) ray irradiation, plasma irradiation, and corona discharge treatment.

The above method may further include degassing process. In the degassing process, the TLCP film(s) may be further subjected to degassing of the film before or after the controlling process of the relative intensity Y (%)

by degassing the film (i) under vacuum of 1500 Pa or lower for 30 minutes or more, and/or by degassing the film (ii) under heating at a temperature ranging from 100° C. to 200° C.

The degassing process may be carried out, for example, by degassing the film under vacuum of 1500 Pa or lower while heating at a temperature ranging from 50° C. to 200° C.

The TLCP film as the adhesive film may have a film thickness of, for example, 10 to 500 μm.

A second aspect of the present invention relates to a method for producing a circuit board comprising a TLCP film as an adherend film and a TLCP film as an adhesive film, the both films being laminated by thermo-bonding, the method including:

preparing the adherend film and the adhesive film as circuit board materials;

stacking the adherend film and the adhesive film in accordance with a predetermined structure of a circuit board to obtain a stacked material, followed by conducting thermo-compression bonding of the stacked material by heating under a predetermined compression pressure; wherein the prepared circuit board materials are independently at least one member selected from the group consisting of an insulating substrate having a conductor layer on at least one surface, a bonding sheet, and a coverlay; and the adhesive film is a TLCP film produced by the above-mentioned film production method.

In the method for producing a circuit board, wherein the adherend film may be an insulating substrate having a conductor circuit on at least one surface; and the adhesive film may be at least one circuit board material selected from the group consisting of an insulating substrate having a conductor layer on at least one surface, a bonding sheet, and a coverlay.

The method further may comprise degassing, as described above, the adherend film and the adhesive film before thermo-compression bonding. For example, the degassing may be carried out under vacuum at a vacuum degree of 1500 Pa or lower for 30 minutes or more at a temperature ranging from 50 to 150° C.

In the circuit board production method, among the circuit board materials selected from the group consisting of an insulating substrate, a bonding sheet, and a coverlay, at least two circuit board materials may comprise a first LCP film (e.g., a high-melting-point film having higher heat resistance) and a second LCP film (e.g., a low-melting-point film having lower heat resistance than the first LCP film). The difference in melting point between the first and second LCP films may be within 60° C.

A third aspect of the present invention relates to a circuit board comprising a TLCP film as an adherend film and a TLCP film as an adhesive film, the both films being laminated by thermo-bonding, wherein the adherend film has a surface portion to be adhered, the surface portion having a relative intensity X (%) calculated as a ratio in percentage of a sum of peak areas of C—O bond peak and COO bond peak based on the total area of C1s peaks in the XPS spectral profile;

the adhesive film has a surface portion to be adhered, the surface portion having a relative intensity Y (%) calculated as a ratio in percentage of a sum of peak areas of C—O bond peak and COO bond peak based on the total area of C1s peaks in the XPS spectral profile;

the relative intensities X and Y satisfy the following formulae (1) and (2)

$$38 \leq X+Y \leq 65 \quad (1)$$

$$-8.0 \leq Y-X \leq 8.0 \quad (2); \text{ and wherein}$$

the circuit board shows a solder heat resistance when the circuit board is placed in a solder bath at a temperature of 290° C. for 60 seconds conforming to a method of JIS C 5012.

For example, the circuit board may be a circuit board produced by the above production method. For example, in the circuit board, a bonding strength between the adherend film and the adhesive film in accordance with JIS C5016-1994 is 0.7 kN/m or higher.

Further, where there is a conductive material portion between the adherend and adhesive films, the surface area ratio of the conductive material portion existing between the adherend and adhesive films may be less than 30%. The difference in melting point between the adhesive film and the adherend film may be within 60° C.

It should be noted that any combination of at least two constructions, disclosed in the appended claims and/or the specification should be construed as included within the scope of the present invention. In particular, any combination of two or more of the appended claims should be equally construed as included within the scope of the present invention.

According to the first aspect relating to a production process of a TLCP film, by performing a specific controlling process for a TLCP film, the TLCP film enables to have a specific relative intensity as a sum of relative peak areas of C—O and COO bond peaks in XPS analysis with respect to a relative intensity of an adherend TLCP film. As a result, a TLCP film can be produced to achieve improved adhesiveness to the corresponding adherend TLCP film.

According to the second and third aspects, by using an adhesive TLCP film that is excellent in thermo-adhesiveness to the corresponding TLCP film as the adherend film, interlayer adhesion between TLCP films can be enhanced so as to suppress local adhesion failure. Accordingly, usage of the specific adhesive film make it possible to efficiently produce a circuit board that can inhibit occurrence of blisters on the circuit board during a high temperature treatment such as a reflow process for mounting electronic components on the circuit board. In particular, since the circuit board can enhance interlayer adhesion without adhesive usage, reliability of the circuit board can be enhanced.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims, and:

DESCRIPTION OF EMBODIMENTS

Method for Producing TLCP Film

Figure 1A:
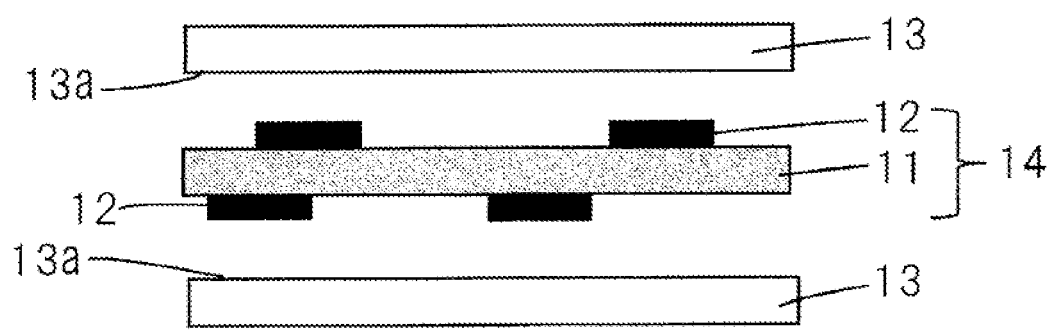
FIGS. 1A and 1B are schematic cross-sectional views for explaining a production process of a circuit board according to an embodiment of the present invention, and show statuses before and after lamination, respectively.

The first aspect of the present invention is based on the findings as below, that is, (i) it has been conventionally recognized as a critical contributor that improvement in adhesiveness of a TLCP film necessarily requires destruction of a surface skin layer of the TLCP film because the skin layer made of rigid mesogenic groups inevitably intervene thermo-adhesion between TLCP films; on the contrary, (ii) it is more important for a plurality of TLCP films that the TLCP films used as an adherend film and an adhesive film should have a specific relationship with each other regarding a sum of relative peak areas of C—O and COO bond peaks based on the total area of C1s peaks in X-ray photoelectron spectroscopy analysis. Surprisingly, where the adherend TLCP film has a specific relationship with an adhesive TLCP film as described above, interlayer adhesion between the TLCP films can be greatly improved in spite of the presence or absence of the destruction of the skin layers.

The first aspect of the present invention relates to a method for producing a TLCP film as an adhesive film to be thermo-bonded to an adherend body of a TLCP film (hereinafter, sometimes referred to as an adherend film), the method at least including:

preparing a TLCP film as the adherend film and a TLCP film as the adhesive film;

examining each of the prepared TLCP films for a relative intensity calculated as a ratio in percentage of a sum of peak areas of C—O bond peak and COO bond peak based on the total area of C1s peaks in the XPS spectral profile so as to calculate X (%) as for the prepared adherend film and Y (%) as for the prepared adhesive film; and controlling the TLCP film as the adhesive film to have a specific relative intensity Y by selection or activation treatment of the adhesive film so that the relative intensity X of the adherend film and the relative intensity Y of the controlled adhesive film satisfy the following formulae (1) and (2):

$$38 \leq X+Y \leq 65 \quad (1)$$

$$-8.0 \leq Y-X \leq 8.0 \quad (2).$$

TLCP Film

The TLCP film to be used as an adherend film as well as an adhesive film is formed from a melt-processable liquid crystalline polymer. Chemical formulation of the thermoplastic liquid crystal polymer is not particularly limited to a specific one as long as it is a liquid crystalline polymer that can be melt-processable, and examples thereof may include a thermoplastic liquid crystal polyester, or a thermoplastic liquid crystal polyester amide obtained by introducing an amide bond thereto.

Furthermore, the thermoplastic liquid crystal polymer may be a polymer obtained by further introducing, to an aromatic polyester or an aromatic polyester amide, an imide bond, a carbonate bond, a carbodiimide bond, or an isocyanate-derived bond such as an isocyanurate bond.

Specific examples of the thermoplastic liquid crystal polymer used in the present invention may include known thermoplastic liquid crystal polyesters and thermoplastic liquid crystal polyester amides obtained from compounds classified as (1) to (4) as exemplified in the following, and derivatives thereof. However, it is needless to say that, in order to form a polymer capable of forming an optically anisotropic melt phase, there is a suitable range regarding the combination of various raw-material compounds.

(1) Aromatic or aliphatic dihydroxy compounds (see Table 1 for representative examples)

TABLE 1

Chemical structural formulae of representative examples of aromatic or aliphatic dihydroxyl compounds

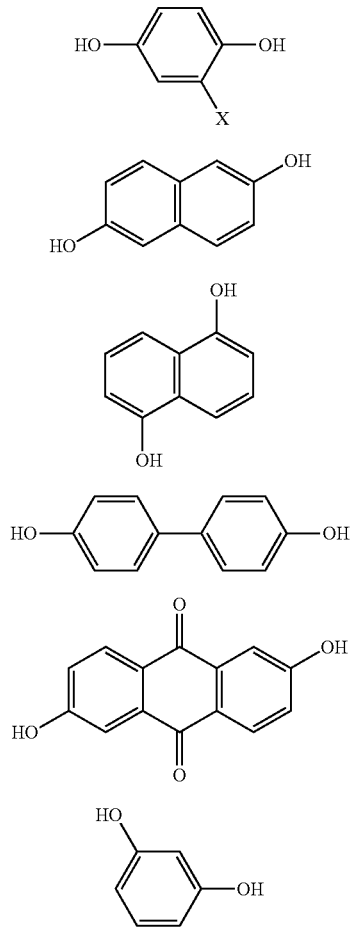

TABLE 1-continued

Chemical structural formulae of representative examples
of aromatic or aliphatic dihydroxyl compounds

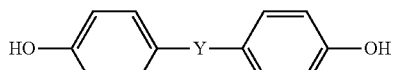

X represents a hydrogen atom or a halogen atom, or a group such as a lower alkyl (e.g., $C_{1-3}$ alkyl) or a phenyl
Y represents a group such as —O—, —$CH_2$—, —S—, —CO—, —C($CH_3$)$_2$—, or —$SO_2$—
n is an integer of 2 to 12

(2) Aromatic or aliphatic dicarboxylic acids (see Table 2 for representative examples)

TABLE 2

Chemical structural formulae of representative examples of
aromatic or aliphatic dicarboxylic acids

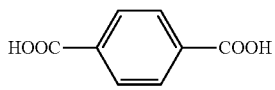

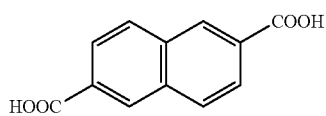 [SMILES: O=C(O)c1ccc2cc(C(=O)O)ccc2c1]

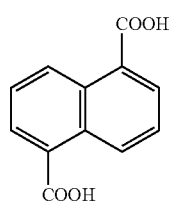 [SMILES: O=C(O)c1cccc2c(C(=O)O)cccc12]

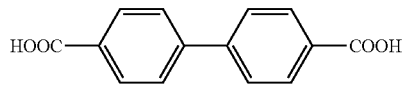

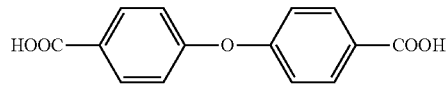 [SMILES: O=C(O)c1ccc(Oc2ccc(C(=O)O)cc2)cc1]

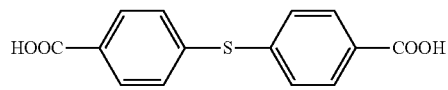 [SMILES: O=C(O)c1ccc(Sc2ccc(C(=O)O)cc2)cc1]

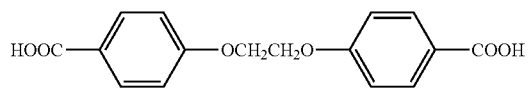

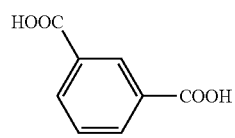

n is an integer of 2 to 12

(3) Aromatic hydroxycarboxylic acids (see Table 3 for representative examples)

TABLE 3

Chemical structural formulae of representative examples of
aromatic or aliphatic hydroxycarboxylic acids

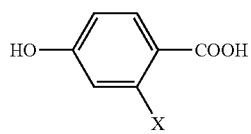

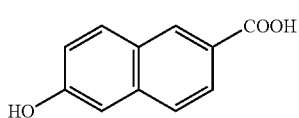

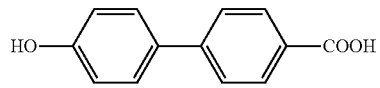 [SMILES: O=C(O)c1ccc(-c2ccc(O)cc2)cc1]

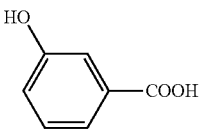

X represents a hydrogen atom or a halogen atom, or a group such as a lower alkyl (e.g., $C_{1-3}$ alkyl) or a phenyl (4) Aromatic diamines, aromatic hydroxy amines, and aromatic aminocarboxylic acids (see Table 4 for representative examples)

TABLE 4

Chemical structural formulae of representative
examples of aromatic diamines,
aromatic hydroxy
amines, or aromatic aminocarboxylic acids

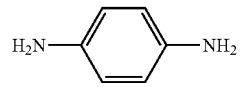

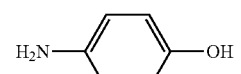

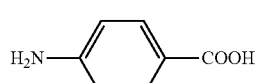

Representative examples of liquid crystal polymers obtained from these raw-material compounds may include copolymers having structural units shown in Tables 5 and 6.

TABLE 5
Representative examples (1) of a thermoplastic liquid crystal polymer
(A) 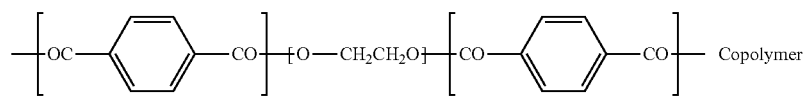 Copolymer
(B) 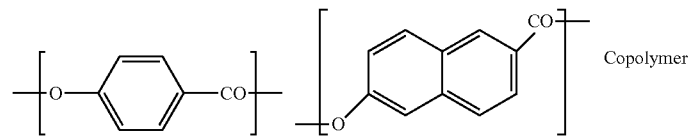 Copolymer
(C) 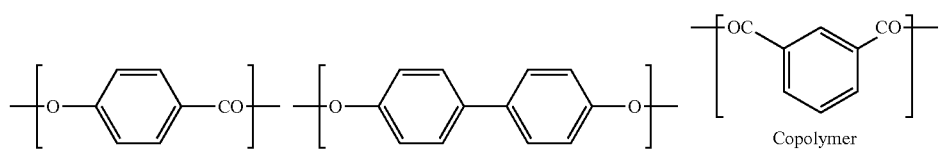 Copolymer
(D) 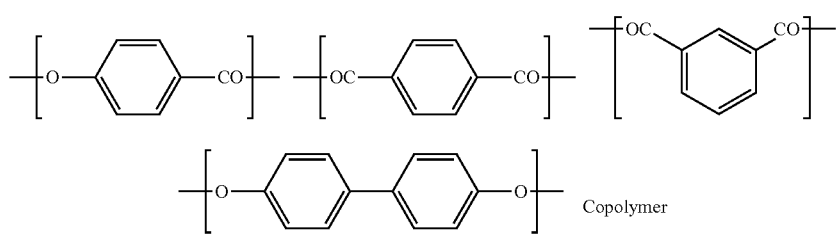 Copolymer
(E) 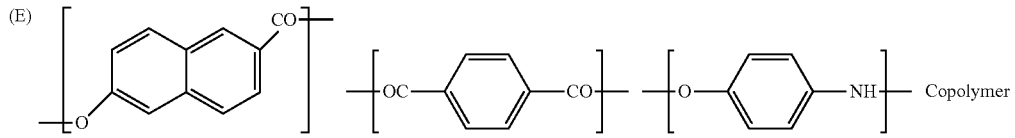 Copolymer
(F) 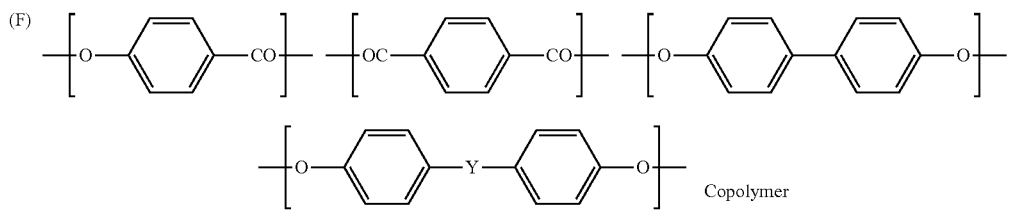 Copolymer
Y is a group such as —O—, —CH$_2$, or —S—
TABLE 6
Representative examples (2) of thermoplastic liquid crystal polymer
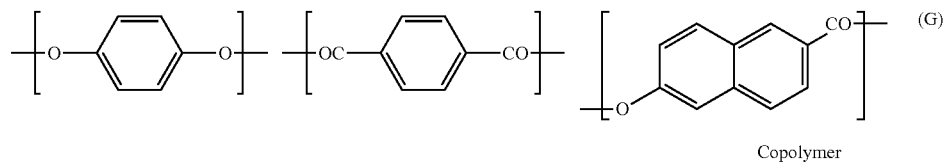 (G) Copolymer
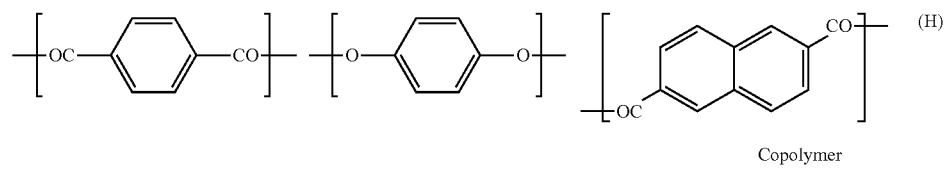 (H) Copolymer TABLE 6-continued Representative examples (2) of thermoplastic liquid crystal polymer

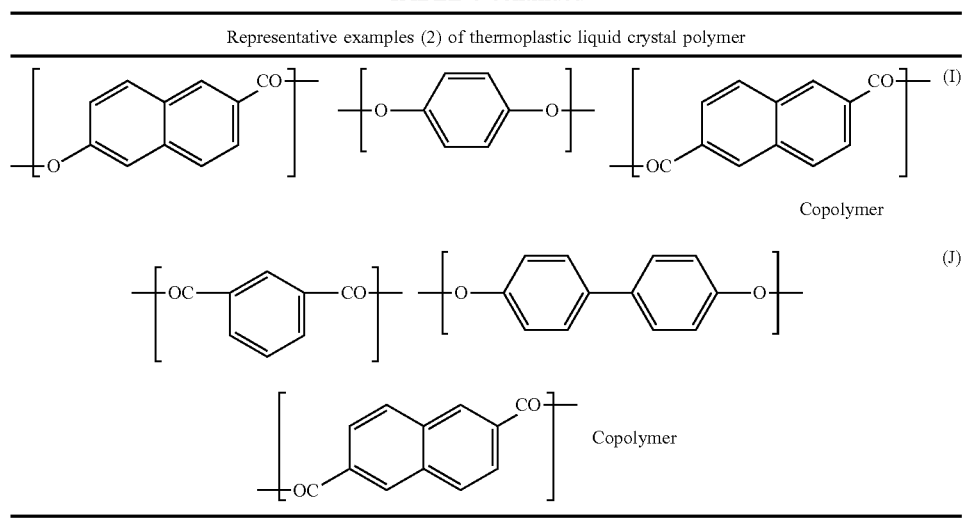

Of these copolymers, polymers including at least p-hydroxybenzoic acid and/or 6-hydroxy-2-naphthoic acid as repeating units are preferable; and particularly preferred polymers include:
  a polymer (i) having repeating units of p-hydroxybenzoic acid and 6-hydroxy-2-naphthoic acid, and
  a polymer (ii) having repeating units of
    at least one aromatic hydroxycarboxylic acid selected from a group consisting of p-hydroxybenzoic acid and 6-hydroxy-2-naphthoic acid,
    at least one aromatic diol selected from a group consisting of 4,4'-dihydroxybiphenyl and hydroquinone, and
    at least one aromatic dicarboxylic acid selected from a group consisting of terephthalic acid, isophthalic acid, and 2,6-naphthalene dicarboxylic acid.

For example, in the case where the polymer (i) comprises a thermoplastic liquid crystal polymer having repeating units of at least p-hydroxybenzoic acid (A) and 6-hydroxy-2-naphthoic acid (B), the liquid crystal polymer may have a mole ratio (A)/(B) of preferably about (A)/(B)=10/90 to 90/10, more preferably about (A)/(B)=50/50 to 85/15, and further preferably about (A)/(B)=60/40 to 80/20.

Furthermore, in the case where the polymer (ii) comprises a liquid crystal polymer having repeating units of at least one aromatic hydroxycarboxylic acid (C) selected from a group p consisting of p-hydroxybenzoic acid and 6-hydroxy-2-naphthoic acid, at least one aromatic diol (D) selected from a group consisting of 4,4'-dihydroxybiphenyl and hydroquinone, and at least one aromatic dicarboxylic acid (E) selected from a group consisting of terephthalic acid, isophthalic acid, 2,6-naphthalene dicarboxylic acid, the liquid crystal polymer may have a mole ratio of aromatic hydroxycarboxylic acid (C):aromatic diol (D):aromatic dicarboxylic acid (E)=30 to 80:35 to 10:35 to 10, more preferably about (C):(D):(E)=35 to 75:32.5 to 12.5:32.5 to 12.5, and further preferably about (C):(D):(E)=40 to 70:30 to 15:30 to 15.

Furthermore, the liquid crystal polymer may have a mole ratio of a repeating structural unit derived from an aromatic dicarboxylic acid relative to a repeating structural unit derived from an aromatic diol of preferably (D)/(E)=95/100 to 100/95. Deviation from this range may tend to result in a low degree of polymerization and deterioration in mechanical strength.

It should be noted that, in the present invention, optical anisotropy in a molten state can be determined by, for example, placing a sample on a hot stage, heating the sample with an elevating temperature under nitrogen atmosphere, and observing light transmitted through the sample.

Preferred thermoplastic liquid crystal polymer has a melting point (hereinafter, referred to as $Tm_0$) in a range from 260° C. to 360° C., and more preferably from 270° C. to 350° C. The melting point is determined by measuring the temperature at which the main endothermic peak appears using a differential scanning calorimeter (Shimadzu Corporation DSC).

As long as the advantageous effect of the present invention is not deteriorated, to the thermoplastic liquid crystal polymer, may be added any thermoplastic polymer such as a polyethylene terephthalate, a modified polyethylene terephthalate, a polyolefin, a polycarbonate, a polyarylate, a polyamide, a polyphenylene sulfide, a polyether ether ketone, and a fluorine resin; and/or various additives. If necessary, a filler may be added to the thermoplastic liquid crystal polymer.

The TLCP film used in the present invention can be obtained by extruding a thermoplastic liquid crystal polymer. As long as the direction of rigid rod-like molecules in the thermoplastic liquid crystal polymer can be controlled, any extrusion method may be applied. In particular, well-known methods such as a T-die method, a laminate-stretching method, and an inflation method (tubular blown film extrusion method) are industrially advantageous. In particular, the inflation method or the laminate-stretching method can apply stresses not only in a machine direction of the film (or the machine processing direction, hereinafter referred to as MD direction), but also in a transverse direction (hereinafter, abbreviated as TD direction) perpendicular to the MD direction. Accordingly, the inflation method or the laminate-stretching method can be advantageously used to obtain a film having controlled properties such as molecular orientation and dielectric characteristics in both the MD and TD directions.

If necessary, the extrusion-molded TLCP film may be further subjected to stretching. The stretching method itself is known, and either biaxial stretching or uniaxial stretching may be employed. From the viewpoint of easy control of molecular orientation, biaxial stretching is preferable. The stretching may be carried out using a known machine such as a uniaxial stretching machine, a simultaneous biaxial stretching machine, and a sequential biaxial stretching machine.

If necessary, a known or conventional heat treatment may be carried out in order to control a melting point and/or thermal expansion coefficient of the TLCP film. Heat treatment conditions can be set appropriately depending on the purpose. The heat treatment may be carried out by heating for several hours at a temperature of, for example, ($Tm_0-10°$ C.) or higher, wherein $Tm_0$ denotes a melting point of a liquid crystal polymer, for example, about ($Tm_0-10°$ C.) to ($Tm_0+30°$ C.), and preferably about $Tm_0°$ C. to ($Tm_0+20°$ C.) to increase a melting point (Tm) of the TLCP film.

Thus-obtained TLCP film according to the present invention has improved properties such as dielectric properties, gas barrier properties and low moisture absorption, thus the TLCP film can be suitably used as a circuit board material.

In order to achieve desired heat resistance and processability of the film, the melting point (Tm) of the TLCP film may be selected in a range from about 200° C. to 400° C., preferably about 250° C. to 360° C., more preferably about 260° C. to 340° C. It should be noted that the melting point of the film could be determined by observing the thermal behavior of the film using a differential scanning calorimeter. That is, a test film is heated at a rate of 20° C./min to completely melt the film, and the melt is rapidly cooled or quenched to 50° C. at a rate of 50° C./min. Subsequently, the quenched material is reheated at a heating rate of 20° C./min., and a position of an endothermic peak appearing in the reheating process may be recorded as a melting point of the film.

The TLCP film may have a Segment Orientation Ratio SOR, as an indicator of isotropic property of the film, of, for example, 0.8 to 1.4, preferably 0.9 to 1.3, more preferably 1.0 to 1.2, and particularly preferably 1.0 to 1.1.

Here, the Segment Orientation Ratio SOR is an index descriptive of a degree of molecular orientation, and represents, unlike the standard MOR (Molecular Orientation Ratio), a value that takes the thickness of an object into consideration.

The TLCP film used in the present invention may have any thickness. Where the TLCP film is used in a high-frequency transmission line, the TLCP film may have a thickness as thick as possible because usage of a thicker film can reduce transmission loss. Where a TLCP film is used as an electrically insulating layer, the film may preferably have a thickness in a range from 10 to 500 µm, and more preferably in a range from 15 to 200 µm. Since a film having too small thickness has small rigidity and poor strength, it is possible to achieve a desired thickness by laminating the films having a thickness in a range from 10 to 200 µm.

Examination of Surface States of Films

Surface states of thermoplastic liquid crystal polymer films as an adherend film and an adhesive film are examined (or detected) by X-ray photoelectron spectroscopy analysis.

In the X-ray photoelectron spectroscopy analysis (XPS analysis), X-ray that is irradiated to a surface of a subject material activates electrons of atomic orbitals in the surface atoms. As a result, the activated electrons are emitted outside the orbitals as photoelectrons. It is possible to determine the species of elements and oxidation states of the elements in the surface of the material by detecting kinetic energies of the photoelectrons.

Energy peak positions of 1s orbital of carbon, hereinafter expressed as C1s peak positions, can be used to examine (evaluate) various bonding states of carbon atoms. For example, in accordance with the XPS analysis in the below-described Examples, it is possible to separate C1s peaks to each of bond peaks such as C—C bond peak at 284.8 eV, C—O bond peak at 286.6 eV, C=O bond peak at 287.6 eV, COO bond peak at 288.6 eV. CO; bond peak at 290 to 291 eV, and π-π* satellite peak at 291.9 eV.

For example, in a first examination, a TLCP film used as an adherend film may be subjected to X-ray photoelectron spectroscopy analysis.

In the first examination, a surface portion of the adherend film to be adhered to the adhesive film is examined (measured) by X-ray photoelectron spectroscopy analysis to determine a relative intensity X (%) that is a sum of C—O and COO peak areas calculated as a ratio in percentage of a sum of peak areas of C—O bond peak and COO bond peak based on the total area of each of the C1s peaks in the XPS spectral profile, where a peak area denotes an area from a background base line to a bond peak. That is, in the examination, the surface of the adherend film was analyzed by X-ray photoelectron spectroscopy to obtain a first relative intensity X (hereafter sometimes referred to as relative intensity X) relating to the adherend film, the first relative intensity X being a ratio in percentage of a sum of peak areas of C—O bond peak and COO bond peak based on the total area of C1s peaks in the XPS spectral profile.

In a second examination, a TLCP film used as an adhesive film may be subjected to X-ray photoelectron microscopy analysis.

In the second examination, a TLCP film is prepared as an adhesive film, and an adhesive surface portion (surface to be adhered to the adherend film) of the film is examined (measured) by X-ray photoelectron spectroscopy analysis to determine a relative intensity Y (%) that is a sum of C—O and COO peak areas calculated as a ratio in percentage of a sum of peak areas of C—O bond peak and COO bond peak based on the total area of each of the C1s peaks in the XPS spectral profile.

In the method for producing the adhesive film, the order of the first and second examinations for determining the surface states of films is not particularly limited. The first examination may be carried out before the second examination, i.e., the surface state of the adherend film may be examined before the examination of the surface state of the adhesive film. Alternatively, the second examination may be carried out before the first examination, i.e., the adhesive film may be subjected to the examination of surface state before the examination of the surface state of the adherend film. Alternatively, the first and second examinations may be substantially simultaneously carried out, i.e., both the adherend and adhesive film may be subjected to the examination of surface states substantially at the same time. After the examination of surface states of the films, the surface state of the adhesive film is controlled in order to have satisfactory adhesiveness to the adherend film.

Control of Surface State

As for the TLCP film as the adhesive film, the surface state of the film has been preliminarily examined. In the controlling process, the TLCP film used as the adhesive film is controlled to have a desired surface state depending on the examination result of the relative intensity X of the adherend film. That is, the TLCP film as the adhesive film may be selected or treated in order for the portion to be adhered to have a second relative intensity Y (hereafter sometimes referred to as relative intensity Y), that is a sum of relative peak areas of C—O and COO bond peaks based on the total area of each of the C1s peaks in the XPS spectral profile.

In the controlling process, the adhesive film is selected or treated such that the relative intensity Y (%) satisfies following formulae (1) and (2) with respect to a predetermined relative intensity X (%):

$$38 \le X+Y \le 65 \quad (1)$$

$$-8.0 \le Y-X \le 8.0 \quad (2).$$

The formula (1) shows that high adhesiveness can be obtained where both of the adhesive film and the adherend film have specific activation energy states. The formula (2) shows that high adhesiveness can be obtained where the surfaces of the adhesive film and the adherend film show similar activation states with each other. Where these formulae are satisfied, it is possible to improve thermo-adhesiveness of the adhesive film to the adherend film, for example, even when the skin layer of the film is not destroyed by an activating treatment.

In the above-described formula (1), for example, X+Y may be 50 or less, or less than 42. In the above-described formula (2), for example, Y−X may be −7.5 or more, −5.0 or more, −2.0 or more, or −1.0 or more.

Y−X may be 7.5 or less, 5.0 or less, 2.0 or less, or 1.0 or less. Y−X may satisfy any combination of the above-described ranges. Preferably, |Y−X| satisfies 7.5 or less, 5.0 or less, 2.0 or less, or 1.0 or less.

Surprisingly, by controlling the surface state of the adhesive film to show a relative intensity Y within the predetermined range depending on the surface state of the adherend film having the relative intensity X, it is possible to improve interlayer adhesiveness between LCP films, even when at least one of the films has a sum of relative peak areas of C—O and COO bond peaks of less than 21% based on the total area of C1s peaks in the XPS spectral profile.

For example, the relative intensity X (%) of the adherend film may be 30% or less (for example, 15 to 30%), preferably 25% or less, more preferably less than 21%, and even more preferably 20% or less.

In relation with the relative intensity X (%) of the adherend film, the relative intensity Y (%) of the adhesive film may be 30% or less (for example, 15 to 30%), preferably 25% or less, more preferably less than 21%, and even more preferably 20% or less.

In the controlling process, the relative intensity Y of the adhesive film is controlled to have a specific value in relation with the relative intensity X of the adherend film depending on the surface state of the adherend film. For example, the adhesive film may be selected from films having a predetermined relative intensity Y in relation with the relative intensity X of the adherend film. Alternatively, where the adhesive film does not have a relative intensity Y within the predetermined range in relation with the relative intensity X of the adherend film, it is possible to control (modify) the relative intensity Y by activating treatment of the surface of the adhesive film.

For example, the relative intensity Y of the adhesive film may be controlled to have a desired value by activating treatment of the film surface, for example, by ultraviolet (UV) ray irradiation, by plasma irradiation, and/or by corona discharge treatment.

For example, the inventor have found that a ratio in percentage of a sum of relative peak areas of C—O and COO bond peaks of an LCP film is increased by enhanced ultraviolet irradiation dose where ultraviolet ray with a predetermined wavelength is irradiated to the surface of the LCP film. Such a phenomenon can be used to control the relative intensity to be in the predetermined range.

In addition, it is expected that a ratio in percentage of a sum of relative peak areas of C—O and COO bond peaks of an LCP film can be increased by enhancing an amount to be treated by other surface activation treatment such as plasma treatment and corona discharge treatment. Therefore, it is also possible to control a sum of relative peak areas of C—O and COO bond peaks of the LCP film so as to be within the predetermined range by the various activation treatments.

In the case of UV irradiation, types of the UV rays are not particularly limited provided that the relative intensity Y can be controlled to be in the predetermined range. For example, UV ray of 185 nm in wavelength or UV ray of 254 nm in wavelength may be irradiated to the film. Alternatively, UV rays having different wavelengths (for examples UV rays of 185 nm and 254 nm in wavelengths) may be irradiated to the film simultaneously.

Preferably, the distance between the film surface to be irradiated and the light source may be shortened so as to irradiate higher energy radiation for a short period of time. For example, the distance between the film surface and the light source may be set in the range of about 0.3 to 5 cm, and preferably about 0.4 to 2 cm. The treatment period may be set arbitrarily. For example, it is possible to employ a treatment period in the range of about 20 seconds to about 5 minutes, and preferably in the range of about 30 seconds to about 3 minutes.

The plasma treatment may be performed under atmospheric pressure or under vacuum conditions. Plasma may be generated by applying microwave or high frequency wave to oxidizing gas introduced into an apparatus. The generated plasma may be irradiated to an object to be treated so as to plasma-treat the surface of the object.

For example, the oxidizing gas may be selected from oxygen and other oxygen-containing gas such as air, carbon mono-oxide, and carbon dioxide.

Preferably, for example, the plasma treatment may be performed under a vacuum pressure of 1000 Pa or less, and preferably 800 Pa or less.

Direct plasma (DP) or reactive ion etching (RIE) may be used in the plasma treatment. The output energy may be arbitrarily selected depending on the irradiation mode, treatment period or the like. For example, the plasma treatment may be performed with output of about 0.2 to about 2.0 W/cm$^2$, and preferably about 0.2 to about 1.0 W/cm$^2$.

The treatment period may be for example in a range of about 30 to 200 seconds, preferably in a range of about 30 to 100 seconds, and more preferably in a range of about 40 to 80 seconds.

In the corona discharge treatment, the film may be passed through a space between an electrode and a roll of dielectric material, both being insulated with each other, and corona discharge is generated by applying high frequency (for example, 40 kHz or the like) and high voltage electric current. The corona discharge produces plasma from gas components such as oxygen, and thereby activating the polymer surface.

For example, metals such as stainless steel and aluminum may be used as the electrode. Ceramics, silicone rubber, EPT rubber, hypalon rubber, or the like may be used as the dielectric material. The electrode may have various shapes such as knife-edge, plate, roll, and wire. The output power may be selected depending on the treatment period or the like. For example, the corona discharge treatment may be performed with output power of about 100 W to about 800 W, and preferably about 200 W to about 600 W. Moving speed of the film may be, for example, about 2 to 10 m/min., preferably about 3 to 9 m/min.

Preferably, after the activating treatment of the adhesive film, the adhesive film may be further subjected to X-ray photoelectron spectroscopy analysis to re-examine the relative intensity Y after the treatment so as to determine whether the relative intensity Y satisfies the above-described formulae 1 and 2. Where necessary, the activation treatment may be preferably performed (repeated) until the relative intensity Y satisfies the above-described formulae 1 and 2.

Degassing Process

If necessary, the adhesive LCP film may be subjected to degassing before or after the controlling process.

The degassing of a TLCP film can be carried out by degassing the TLCP film under a specific vacuum condition and/or degassing under a specific heat condition to reduce gas components in the TLCP film at an extremely low degree. As a result, surprisingly, the TLCP film that has undergone such a degassing process can improve the thermo-adhesive property.

In the degassing process, degassing of the TLCP film can be carried out (i) by degassing under vacuum of 1500 Pa or lower for 30 minutes or more, and/or (ii) by degassing under heating at a temperature ranging from 100° C. to 200° C.

The degassing process may be carried out in a condition satisfying either degassing (i) under vacuum, or degassing (ii) under heating, preferably in a condition satisfying both (i) and (ii).

Where degassing under vacuum (i) and degassing under heating (ii) are carried out in combination to the extent that thermo-adhesiveness of the TLCP film is capable of being increased, the degassing processes (i) and (ii) may be carried out in any order, preferably carried out by degassing under heating (ii) as a first degassing, followed by degassing under vacuum (i) as a second degassing.

Specifically, for example, degassing process may comprise a first degassing process in which degassing of the adhesive film is carried out under heating at a temperature ranging from 100° C. to 200° C. for a predetermined time, and a second degassing process in which degassing of the adhesive film is carried out under vacuum of 1500 Pa or lower for another predetermined time. These degassing processes may be appropriately carried out by combining the above-mentioned conditions.

Moreover, from the viewpoint of improving degassing efficacy, degassing may be carried out without substantial pressurization (under pressure release). For example, degassing may be carried out under a minimum pressure or pressure-released state (for example, under a compression pressure of about 0 to 0.7 MPa, preferably under a compression pressure of about 0 to 0.5 MPa).

Degassing under vacuum (i) may be carried out at a vacuum degree of 1500 Pa or lower, preferably 1300 Pa or lower, and more preferably 1100 Pa or lower.

Where degassing under vacuum is performed independently, degassing may be carried out at an ambient temperature (for example, from 10° C. to 50° C., preferably from 15° C. to 45° C.). In view of enhancing the degassing efficiency, degassing may be carried out under heating, for example, at a heating temperature ranging from 50° C. to 200° C. (for example, from 50° C. to 150° C.), preferably from 80° C. to 200° C., and more preferably from about 90° C. to about 190° C.

Degassing under heating (ii) may be carried out in a range from 100° C. to 200° C., preferably from 105° C. to 190° C., and more preferably from 110° C. to 180° C.

Degassing temperature under heating may be set in a predetermined temperature range with respect to a melting point (Tm) of the TLCP film. Degassing may be carried out by heating at a temperature ranging from (Tm-235° C.) to (Tm-50° C.) [e.g., from (Tm-200° C.) to (Tm-50° C.)], preferably, from (Tm-225)° C. to (Tm-60° C.) [e.g., from (Tm-190° C.) to (Tm-60° C.)], and more preferably from (Tm-215° C.) to (Tm-70° C.) [e.g., from (Tm-180)° C. to (Tm-70)° C.].

By heating the TLCP film in a specific temperature range as described above, while suppressing rapid moisture generation from the film, the moisture in the film (for example, inside or on a surface of the film) can be degassed as water vapor, or the air on the surface of the film can be degassed by enhancing kinetic energy of the air.

It should be noted that where degassing under heating is carried out independently, the degassing might be carried out under a condition that does not contain the vacuum condition of 1500 Pa or lower. For example, degassing may be carried out by heating under an atmospheric pressure (or ambient pressure) where the pressure is not specifically adjusted. Alternatively, if necessary, degassing may be carried out by heating under a reduced pressure from the atmospheric pressure (for example, beyond 1500 Pa and less than 100000 Pa, preferably about 3000 to 50000 Pa).

The period of time required for degassing procedure may be suitably set depending on various conditions such as a state of the TLCP film, a vacuum degree, and/or a heating temperature. In view of removing moisture and air from the entire TLCP film, the period for degassing for the degassing process (i) and/or the degassing process (ii) (i.e., under vacuum, under heating, under vacuum while heating) may be same or different. The degassing period may be 30 minutes or more, 40 minutes or more, or 50 minutes or more. The degassing period may be 6 hours or less, 4 hours or less, 3 hours or less, 2 hours or less, or 1.5 hours or less.

Alternatively, the degassing period may be set appropriately depending on the moisture content in the TLCP film, for example, may be carried out until the TLCP film has a desired moisture content range to be described later (for example, 300 ppm or less, or 200 ppm or less).

The TLCP film obtained by the degassing process may have extremely low moisture. The moisture content may be, for example, 300 ppm or less, preferably 200 ppm or less, more preferably 180 ppm or less, and even more preferably 150 ppm or less. Here, the moisture content indicates a value measured by the method described in Examples below.

The TLCP film may have a dielectric loss tangent at 25 GHz of, for example, 0.0025 or less (e.g., about 0.0001 to 0.0023), and preferably about 0.0010 to 0.0022. The TLCP film having such a dielectric loss tangent enables to lower power consumption as well as to reduce noise.

The relative dielectric constant of the TLCP film varies depending on the thickness of the film. The TLCP film may have a relative dielectric constant at 25 GHz in the TD direction, for example, of 3.25 or less (e.g., about 1.8 to 3.23), and preferably about 2.5 to 3.20. It should be noted that the dielectric constant can be generally calculated by multiplying the vacuum dielectric constant ($=8.855\times10^{-12}$ (F/m)) to relative dielectric constant.

For example, the dielectric constant measurement may be carried out by a resonance perturbation method at a frequency of 1 GHz. Where a 1 GHz cavity resonator (manufactured by Kanto Electronic Application and Development Inc.) is connected to a network analyzer ("E8362B", manufactured by Agilent Technologies, Inc.), and a small sample (width: 2.7 mm×length: 45 mm) is inserted into the cavity resonator, the dielectric constant and the dielectric loss tangent of the sample can be measured from the change in resonance frequency before and after inserting the material to expose the material to an environment at a temperature of 20° C. and a humidity of 65% (RH) for 96 hours.

Method for Producing Circuit Board

An embodiment of the present invention may include a method for producing a circuit board having an improved interlayer adhesion.

The method for producing a circuit board comprising a TLCP film as an adherend film and a TLCP film as an adhesive film, the both films being laminated by thermo-bonding, the method including:

preparing the adherend film and the adhesive film as circuit board materials;

stacking the adherend film and the adhesive film in accordance with a predetermined structure of a circuit board to obtain a stacked material, followed by conducting thermo-compression bonding of the stacked material by heating under a predetermined compression pressure; wherein the prepared circuit board materials are independently at least one member selected from the group consisting of an insulating substrate having a conductor layer on at least one surface, a bonding sheet, and a coverlay; and the adhesive film is a TLCP film produced by the above-described method.

Preparation of Circuit Board Materials

In the preparation process, there are prepared an adherend body comprising a TLCP film (hereinafter sometimes simply referred to as an adherend film) and an adhesive film comprising a TLCP film (hereinafter sometimes simply referred to as an adhesive film). The adherend film as well as the adhesive film are prepared as circuit board materials comprising independently at least one member selected from the group consisting of an insulating substrate, a bonding sheet, and a coverlay, where the insulating substrate having a conductor layer (e.g., a conductor circuit or a conductor pattern, a conductor foil, a conductor film) on at least one surface.

Examples of the insulating substrates each having a conductor layer on at least one surface may include:

a unit circuit board comprising an insulating substrate and a conductor circuit or pattern formed on one surface of the insulating substrate;

a unit circuit board comprising an insulating substrate and conductor circuits or patterns formed on both surfaces of the insulating substrate, respectively;

a unit circuit board comprising an insulating substrate, a conductor circuit or pattern formed on one surface of the insulating substrate, and a conductor film or foil formed on the other surface of the insulating substrate; and others.

The conductor layer can be at least formed for example from a conductive metal. By using a known circuit processing method, the conductor layer may be formed into any pattern of circuits. As the conductor for forming a conductor layer, there may be mentioned various metals having conductivity, such as gold, silver, copper, iron, nickel, aluminum, and an alloy metal thereof.

Any known method may be used as a method for forming a conductor layer on an insulating substrate of a TLCP film. For example, a metal layer may be formed by evaporation, electroless plating, and/or electrolytic plating. Alternatively, a metal foil (for example, copper foil) may be thermo-compression bonded on a surface(s) of the TLCP film.

The metal foil constituting the conductor layer may be preferably a metal foil used in electrical connections. Examples of the metal foils may include a copper foil, as well as various metal foils such as gold, silver, nickel, aluminum foils, and also an alloy foil comprising these metals in a substantial manner (for example, 98% by weight or greater).

Of these metal foils, a copper foil can be preferably used. The species of the copper foil is not particularly limited, and can be any of copper foil usable in the circuit board, for example, a rolled copper foil or an electrolytic copper foil.

The combination of the adherend film and the adhesive film is not limited to a specific one as long as the adhesive film has an above-described specific relationship to the adherend film and both films are laminated by thermo-bonding.

For example, the adherend film may be an insulating substrate having a conductor circuit on at least one surface, and the adhesive film may be at least one member selected from the group consisting of an insulating substrate having a conductor circuit on at least one surface, a bonding sheet, and a coverlay.

For example, the adhesive film may be an insulating substrate having a conductor circuit on at least one surface, and the adherend film may be at least one member selected from the group consisting of an insulating substrate having a conductor circuit on at least one surface, a bonding sheet, and a coverlay.

Examples of combinations of the adhesive and adherend films may include:

(a) a circuit board at least including an adherend film as an insulating substrate and an adhesive film as a coverlay to cover a conductor circuit formed on the adherend film (here the adhesive film is controlled to have a predetermined relative intensity Y respective to the relative intensity X of the adherend film);

(b) a circuit board at least including a first adherend film and a second adherend film as insulating substrates and an adhesive film as a bonding sheet to adhere to both of the first and second adherend films (here the adhesive film is controlled to have predetermined relative intensities Y1 and Y2 on each of the adhesive surfaces respective to the relative intensities X1 and X2 of the first and second adherend films, respectively);

(c) a circuit board at least including an adhesive film as an insulating substrate and an adherend film as a coverlay to cover a conductor circuit formed on the adhesive film (here the adherend film is controlled to have a predetermined relative intensity Y respective to the relative intensity X of the adherend film);

(d) a circuit board at least including a first adhesive film and a second adhesive film as insulating substrates and an adherend film as a bonding sheet to adhere both the first and second adhesive films (here the adhesive film is controlled to have a predetermined relative intensities Y1 and Y2 on each of the adhesive surfaces respective to the relative intensities X1 and X2 of the first and second adherend films, respectively);

(e) a circuit board at least including an adherend film as a first insulating substrate and an adhesive film as a second insulating substrate to be adhered to the first insulating substrate (here the adhesive film is controlled to have a predetermined relative intensity Y respective to the relative intensity X of the adherend film); and other combinations.

It should be noted that, if necessary, a coverlay might be optionally provided to cover a conductor circuit of an insulating substrate on an outermost layer. In such a case, the coverlay and the insulating substrate may be an adhesive film and an adherend film, respectively, or vice versa. In any case, there is a specific relationship between adherend and adhesive LCP films adjacent with each other such that the adhesive film have a predetermined relative intensity Y respective to the relative intensity X of the adherend film.

Among them, a preferable embodiment includes a circuit board including an adherend film as an insulating substrate having a conductor circuit on at least one surface and an adhesive film as at least one circuit board material selected from the group consisting of an insulating substrate having a conductor circuit on at least one surface, a bonding sheet, and a coverlay.

In the circuit board, the TLCP film type of the adherend film may be same with or different from the type of the adhesive film. For example, the adherend film and the adhesive film may be a first TLCP film and a second TLCP film, respectively. For example, the first TLCP film may have a melting point that is same with a melting point of the second TLCP film. Alternatively, the first TLCP and second TLCP films may have melting points that are different from each other, i.e., one may be a TLCP film having a higher melting point (for example, a melting point of about 300 to 350° C.), or a high-melting-point TLCP film, and the other may be a TLCP film having a lower melting point (for example, a melting point of about 250 to 300° C.) than that of the former TLCP film, or a low-melting-point TLCP film. For example, the difference in melting point between the first and second LCP films may be, for example, in a range about from 0 to 60° C., and more preferably about from 0 to 50° C. (for example 10° C. to 50° C.).

The adhesive film may be used as a high-melting-point TLCP film or as a low-melting-point TLCP film. For example, the adherend film and the adhesive film may be both high-melting-point TLCP films; alternatively, the adherend film and the adhesive film may be both low-melting-point TLCP films. For example, in this case, difference in melting point between the adherend film and the adhesive film may be, for example, about 0° C. to 20° C., and more preferably about 0° C. to 10° C.

Alternatively, one of the adherend film and the adhesive film may be a high-melting-point TLCP film and the other may be a low-melting-point TLCP film. In this case, the adhesive film may be a low-melting-point TLCP film.

In this case, particularly preferable embodiments may include a circuit board including an adherend film of a high-melting-point TLCP film as an insulating substrate, and an adhesive film of a low-melting-point TLCP film as an coverlay and/or a bonding sheet; a circuit board including an adherend film and an adhesive film, in which both films constitute insulating substrates each having a conductor circuit on at least one surface, and are directly bonded to each other without a bonding sheet.

Thermo-Compression Bonding Process

In the thermo-compression bonding process, the adherend film(s) and the adhesive film(s), both prepared as the circuit board materials are stacked (overlaid), and the stacked circuit board materials are thermo-compression bonded by heating at a predetermined compression pressure.

The stacked circuit board materials may have a structure in accordance with the before-mentioned combinations (a) to (e) or others so that the adherend film(s) and the adhesive film(s) are provided.

Optionally, before thermo-compression bonding process, the above-described degassing process may be carried out to improve thermo-adhesiveness of TLCP films.

The degassing process may be carried out by degassing the films (i) under vacuum of 1500 Pa or lower for 30 minutes or more, and/or by degassing the films (ii) under heating at a temperature ranging from 100° C. to 200° C., and thereby degassing TLCP films. Further, as one embodiment of the degassing (i) under vacuum of 1500 Pa or lower for 30 minutes or more, a pre-heating may be carried out. In this case, the pre-heating process may be carried out prior to the thermo-compression bonding, for example, in a heating temperature range from 50° C. to 150° C.' under vacuum of 1500 Pa or lower for 30 minutes or more. The heating temperature during the pre-heating process may be preferably about 60° C. to 120° C., and more preferably 70° C. to 110° C.

Such a pre-heating process makes it possible to remove air and/or moisture on and/or in the LCP film to some extent. As a result, it is possible to improve the interlayer adhesion in the circuit board even without an adhesive agent.

The pre-heating process may be carried out under a vacuum degree of 1500 Pa or less, preferably 1300 Pa or less, and more preferably 1100 Pa or less.

During the pre-heating process, a compression pressure may be applied to the circuit board material within a range that does not inhibit the effect of the invention. The compression pressure in the pre-heating process may be, for example, 0.8 MPa or less, and more preferably 0.6 MPa or less. The pre-heating process may be preferably carried out with applying a compression pressure as low as possible, preferably substantially without applying a compression pressure.

The pre-heating process may be carried out for about 30 minutes or more, for example, for about 30 to 120 minutes, preferably about 40 to 100 minutes, and more preferably about 45 to 75 minutes.

Thermo-compression bonding of a stacked body can be carried out by using a vacuum hot press apparatus, a heating roll lamination equipment, or others, depending on the type of circuit board materials. From the viewpoint of reducing further gas from the LCP film, it is preferable to use a vacuum hot press apparatus.

The heating temperature in the thermo-compression bonding may be a temperature for example from (Tm−20° C.) to (Tm+40° C.), and preferably from (Tm−10° C.) to (Tm+30° C.), where Tm denotes the melting point of the TLCP film to be bonded (where TLCP films having different melting points with each other, Tin denotes a lower melting point in the films).

Also, the pressure applied during thermo-compression bonding can be selected, depending on the LCP film characteristics, for example, from a wide range from 0.5 to 6 MPa. Where an adhesion-improved LCP film(s) undergone the degassing process is (are) used for bonding, satisfactory adhesion between LCP film layers can be achieved even at a pressing pressure of 5 MPa or less, particularly 4.5 MPa or less, resulting in avoidance of local adhesion failure caused by air introduction in a circuit board even after bonding.

The time required for the thermo-compression bonding (retention time under a constant temperature and pressure) is not particularly limited as far as the circuit board can have an improved interlayer adhesion, and for example, may be about 15 to 60 minutes, and preferably about 20 to 40 minutes.

It should be noted that the method for producing the circuit board might include, if necessary, various producing processes that are known or conventional (e.g., circuit formation process, through-connection process, inter-layer connection process).

Hereinafter, with reference to the drawings, as an embodiment according to the present invention, there may be mentioned a method for producing a circuit board. It should be noted that the scope of the present invention is not limited to these embodiments.

FIG. 1A is a schematic sectional view showing a circuit board in a state before stacked where both surfaces of the insulating substrate having conductor circuit on both surfaces are covered with coverlays. Here are prepared a first unit circuit board 14 that comprises a first TLCP film 11 as an insulating substrate and conductor circuits (e.g., strip line pattern) formed on both surfaces of the film 11; and second TLCP films 13, 13 as coverlays provided on both surfaces of the first unit circuit board 14. Here the first TLCP film is an adherend film and the second TLCP films are adhesive films. The first TLCP film and the second TLCP film are controlled to have a specific relationship with each other regarding a sum of relative peak areas of C—O and COO bond peaks in each of the XPS spectral profiles as described above.

Before carrying out thermo-compression bonding, the adhesive film and/or the adherend film may be heated for a predetermined time preferably under a nitrogen gas atmosphere (first degassing process). The conditions for degassing temperature and degassing time may follow the conditions described above.

Figure 1B:
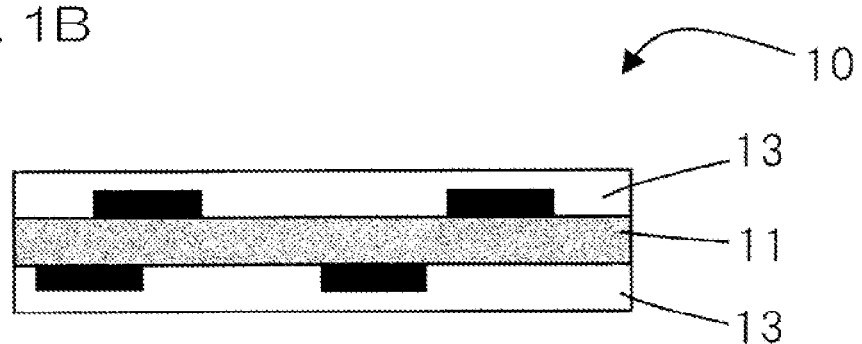

Thereafter, the coverlays 13, 13 and the first unit circuit board 14 interposed between the coverlays are placed in stack in a chamber of a vacuum hot press apparatus (not shown) so as to obtain a stacked body as shown in FIG. 1B. Then, heating treatment may be carried out for a predetermined time (second degassing process) while retaining a vacuum degree of 1500 Pa or lower by vacuuming. The conditions for degassing temperature and degassing period may follow the conditions described above.

Then, while maintaining the vacuum degree of 1500 Pa or lower, the heating temperature may be elevated to a temperature for carrying out a thermo-compression bonding to laminate each of the layers in the stacked body under a predetermined compression pressure. The conditions of temperature as well as period for thermo-compression bonding may follow the conditions described above.

Thereafter, according to a conventional process, the conditions inside the apparatus are returned to ambient temperature and ambient pressure so as to collect a circuit board 10 from the apparatus.

In the above embodiment, the first unit circuit board 14 is attached to both of the coverlays 13, 13. Alternatively, as a modified embodiment, a bonding sheet may be interposed between the first unit circuit board and a second unit circuit board. As a further modified embodiment, unit circuit boards are directly bonded with each other without a bonding sheet.

In the embodiment shown in FIG. 1B, the circuit board has two conductor layers. The number of conductor layers may be set appropriately, and may be one or more layers (for example, 2 to 10 layers).

Figure 2A:
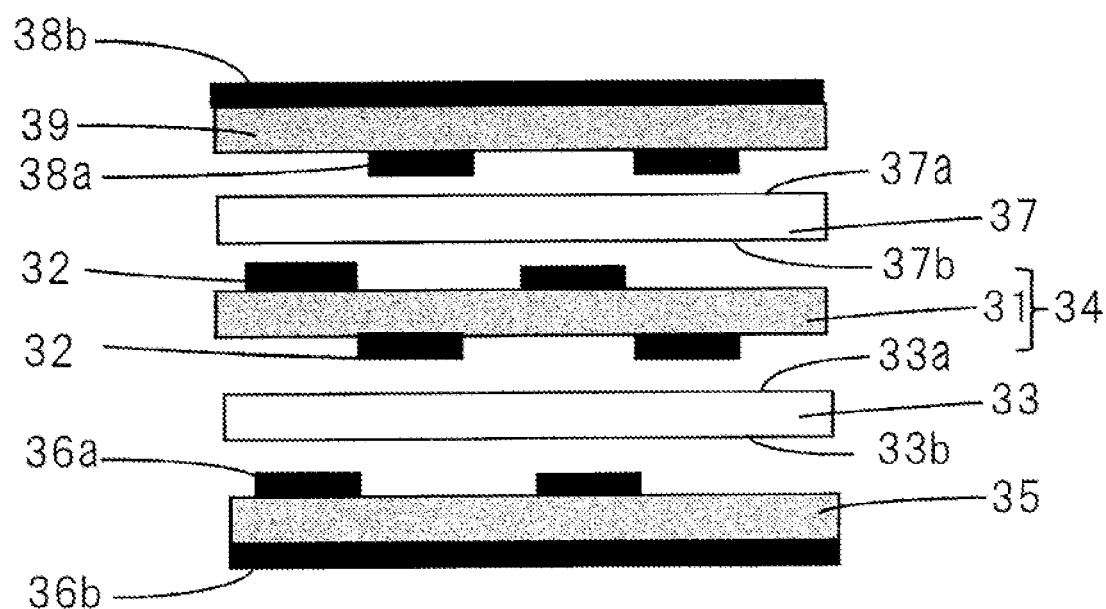
FIGS. 2A and 2B are schematic cross-sectional views for explaining a production process of a circuit board according to another embodiment of the present invention, and show statuses before and after lamination, respectively.

FIG. 2A is a schematic sectional view showing a status before lamination of a circuit board including a first unit circuit board 34 that comprises an insulating substrate 31 and conductor circuits 32, 32 formed on both surfaces of the substrate; an upper unit circuit board that comprises an insulating substrate 39 and a conductor circuits 38a and a conductor layer 38b formed on both surfaces of the substrate, respectively; a lower unit circuit board that comprises an insulating substrate 35 and a conductor circuits 36a and a conductor layer 36b formed on both surfaces of the substrate, respectively; and bonding sheets 33 and 37 for bonding the unit circuit boards. The number of conductor layers is 6 layers in the circuit board.

Each of the first TLCP films 31, 35, and 39 as insulating substrates constitutes an adherend film. Each of the second TLCP films 33 and 37 as bonding sheets constitutes an adhesive film. The first TLCP films and the second TLCP films are controlled to have a specific relationship with each other regarding a sum of relative peak areas of C—O and COO bond peaks in each of the XPS spectral profiles as described above.

Before carrying out thermo-compression bonding, the adhesive film and/or the adherend film may be heated for a predetermined time preferably under a nitrogen gas atmosphere (first degassing process). The conditions for degassing temperature and degassing period may follow the conditions described above.

Figure 2B:
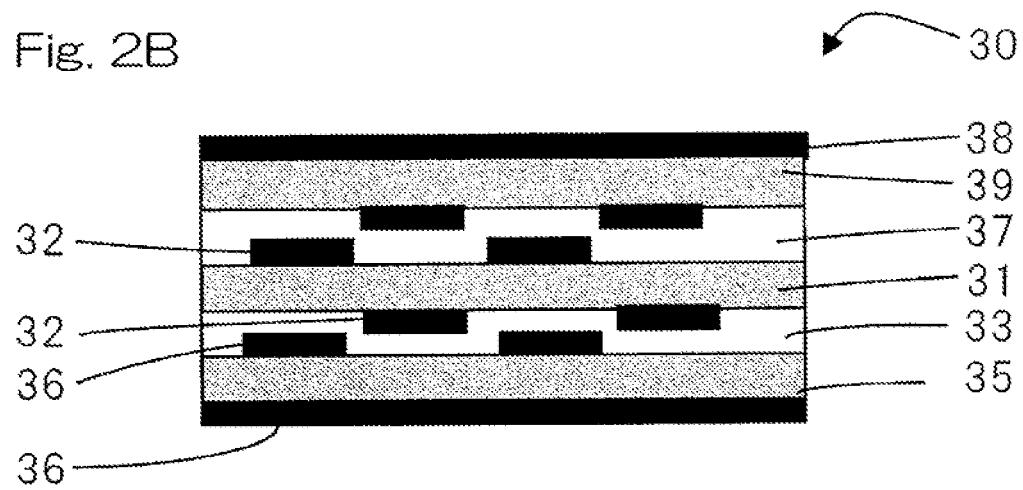

Thereafter, the circuit board materials are placed in stack in a chamber of a vacuum hot press apparatus (not shown) so as to obtain a stacked body as shown in FIG. 2B. In the stacked body, the first unit circuit board 34 is interposed between the bonding sheets 33, 37; the conductor circuits 36a and 38b of the unit circuit board are attached to the bonding sheets 33, 37, respectively. Then, heating treatment may be carried out for a predetermined period (second degassing process) while retaining a vacuum degree of 1500 Pa or lower by vacuuming. The conditions for degassing temperature and degassing period may follow the conditions described above.

Subsequently, while maintaining the vacuum degree of 1500 Pa or lower, the heating temperature is elevated to a temperature condition for carrying out a thermo-compression bonding to laminate each of the layers in the stacked body under a predetermined compression pressure. The conditions of temperature as well as period for thermo-compression bonding may follow the conditions described above.

Thereafter, according to a conventional process, the conditions inside the apparatus are returned to ambient temperature and ambient pressure so as to collect a circuit board 30 from the apparatus.

Circuit Board

The third aspect of the present invention relates to a circuit board.

The circuit board comprises a TLCP film as an adherend film and a TLCP film as an adhesive film, the both films being laminated by thermo-bonding, wherein
- the adherend film has a surface portion to be adhered, the surface portion having a relative intensity X (%) calculated as a ratio in percentage of a sum of peak areas of C—O bond peak and COO bond peak relative to the total area of C1s peaks in the XPS spectral profile;
- the adhesive film has a surface portion to be adhered, the surface portion having a relative intensity Y (%) calculated as a ratio in percentage of a sum of peak areas of C—O bond peak and COO bond peak relative to the total area of C1s peaks in the XPS spectral profile;
- the relative intensities X and Y satisfy the following formulae (1) and (2):

$$38 \leq X+Y \leq 65 \qquad (1)$$

$$-8.0 \leq Y-X \leq 8.0 \qquad (2); \text{ and wherein}$$

- the circuit board shows a solder heat resistance when the circuit board is placed in a solder bath at a temperature of 290° C.' for 60 seconds conforming to a method of JIS C 5012.

Preferably, the relative intensities X and Y may appropriately satisfy the above-described relationship with respect to each of the X+Y and Y−X.

The circuit board may be either a single-layer circuit board or a multi-layer circuit board. Further, the circuit board may be a circuit board produced by the above production method.

In the circuit board according to the present invention, since the adhesive film is controlled to have a relative intensity Y in a specific range with respect to the relative intensity X of the adherend film, the circuit board has an improved interlayer adhesion between LCP films.

The circuit board has an improved heat resistance, and is a circuit board showing a solder heat resistance when the circuit board is placed in a solder bath at a temperature of 290° C. for 60 seconds conforming to a method of JIS C 5012. The solder heat resistance may be evaluated by observing a substrate sample that is subjected to solder float test in a solder bath at a temperature of 290° C. for 60 seconds conforming to a method of JIS C 5012 to be determined whether the substrate sample has blisters each having an area of 100 μm×100 μm or wider by sight or using an optical microscopy (5 magnifications or higher).

Where there is a conductive material portion between the adherend and adhesive films, the surface area ratio of the conductive material portion existing between the adherend and adhesive films may be less than 30%. It should be noted that the existing ratio of conductive material might be determined as follows:

$$\text{Existing ratio of conductive material} = \left(\begin{array}{c}\text{Surface area of}\\ \text{conducive material on}\\ \text{the adhered surface}\end{array}\right) \bigg/ \left(\begin{array}{c}\text{Surface area of}\\ \text{the adhered surface}\end{array}\right) \times 100$$

Further, since the circuit board has an improved interlayer adhesion between LCP films, the bonding strength between two LCP films (one is an adherend film and the other is an adhesive film) may be, for example, 0.7 kN/m or higher (e.g., 0.72 to 3 kN/m), more preferably 0.75 kN/m or higher (e.g., 0.76 to 3 kN/m), further preferably 0.8 kN/m or higher (e.g., 0.83 to 3 kN/m), still further preferably 1.0 kN/m or higher (e.g., 1.1 to 3 kN/m), and particularly preferably 1.2 kN/m or higher (e.g., 1.3 to 3 kN/m).

It should be noted that upon determining interlayer adhesion, existence of cohesive failure could be generally determined as an evidence of good bonding. In contrast, occurrence of interfacial separation shows poor bonding in many cases.

Preferably, the circuit board is generally improved in bonding strength in every direction. For example, with respect to a first direction (A direction) of a circuit board sample and a second direction (B direction) perpendicular to the first direction, where bonding strengths of the sample are measured in four direction by peeling from both sides, i.e., in a forward A direction, in an adverse A direction, in a forward B direction, and in an adverse B direction, the minimum bonding strength in the four directions between the adherend film and the adhesive film may be 0.5 kN/m or higher (e.g., 0.5 to 3 kN/m), preferably 0.6 kN/m or higher, more preferably 0.7 kN/m or higher, still more preferably 0.8 kN/m or higher, and particularly preferably 0.9 kN/m or higher.

Since the circuit board according to the present invention can employ, as an insulating material, a thermoplastic liquid crystal polymer excellent in dielectric characteristics, the circuit board can be used particularly suitably as a high frequency circuit board. Examples of high frequency circuits include a circuit for transmitting mainly (only) high frequency signals; in addition; a circuit for a transmission line transmitting low frequency signals, for example, a circuit for a transmission line transmitting low frequency signals as output after converting high frequency signals into low frequency signals, a circuit for a transmission line supplying electronic power to drive high frequency-corresponding parts; as well as a circuit provided with the above circuits or transmission lines on the same plane.

EXAMPLES

Hereinafter, the present invention is described in greater detail by examples, but the invention is not limited in any way by the present invention to this embodiment. In the following Examples and Comparative Examples were measured for various physical properties by the following method.

Melting Point

Melting point of a film was determined based on the observation of thermal behavior of the film using a differential scanning calorimeter. A test film was heated at a rate of 20° C./min to completely melt the film, and the melt was rapidly cooled to 50° C. at a rate of 50° C./min. Subsequently, the quenched material was reheated at a heating rate of 20° C./minute, and a position of an endothermic peak appearing in the reheating process was recorded as a melting point of the film.

Peak Areas Obtained by X-Ray Photoelectron Spectroscopy Analysis

X-Ray Photoelectron Spectroscopy Analysis

Using PHI Quantera SXM. (available from ULVAC-PHI, INCORPORATED), a sample is subjected to spectroscopic analysis in the following condition so as to calculate a relative intensity (%) of C—O and COO bond peaks as a ratio in percentage of a sum of peak areas of C—O bond peak and COO bond peak based on the total area of C1s peaks in the XPS spectral profile. It should be noted that analysis of the unit circuit board is carried out on the LCP film surface on which the circuit is not formed.

X-ray excitation conditions: 100 μm-25 W-15 kV
Anode: Al (aluminum)
Measurement range: 1000 μm×1000 μm
Pressure: $1\times10^{-6}$ Pa
With no sample washing Further, attribution of functional groups related to carbon and oxygen was determined in accordance with the method shown below.

Regarding C1s
 C—C: 284.8 eV; C—O: 286.4 eV; C=O: 287.6 eV; O—C=O: 288.6 eV; $CO_3$: 290-291 eV; and ShakeUp: 291 eV Regarding O1s
 C—O: 532.0 eV; C—O: 533.1 eV Measurement of Ultraviolet-Ray Irradiation Dose Using an ultraviolet illuminometer (UV-M03A) available from OAC MANUFACTURING CO., LTD., ultraviolet illumination was measured in the width direction to obtain an average value of three points.

Moisture Content

Karl Fischer method was employed as a measuring method of moisture content, that is, moisture content was measured by observing change in potential difference before and after allowing moisture absorbed in a solvent in accordance with the principle of the Karl Fischer titration.

(1) Device name for trace moisture measurement: VA-07, CA-07 available from Mitsubishi Chemical Analytech Co., Ltd.
(2) Heating temperature: 260° C.
(3) Na purge pressure: 150 mL/min.
(4) Measurement preparation (automatic)
Purge: 1 minute
Pre-heat: 2 minutes for baking a sample board
Cooling: 2 minutes for cooling the sample board
(5) Measurement
Time for accumulating moisture in a measurement titration cell, i.e., time for sending moisture with $N_2$: 3 minutes
(6) Sample weight: 1.0 to 1.3 g Segment Orientation Ratio (SOR)

Using a microwave type molecular orientation meter, a liquid crystal polymer film is inserted into a microwave resonance waveguide tube such that a propagation direction of microwave is perpendicular to the film surface, and electric-field strength (microwave transmission intensity) of microwave transmitting through the film is measured. Then, based on the measured value, m value (referred to as refractive index) is calculated from the following formula:

$$m=(Zo/\Delta z) \times [1-v max/vo]$$

Here, Zo represents a device constant, $\Delta z$ represents an average thickness of an object subjected to the measurement, vmax represents the frequency at which the maximum microwave transmission intensity can be obtained when the frequency of the microwave is varied, and vo represents the frequency at which the maximum microwave transmission intensity can be obtained when the average thickness is zero, that is, when no object is present.

Next, when the rotation angle of the object relative to the direction of oscillation of the microwaves is 0°, that is, when the direction of oscillation of the microwaves is aligned with the direction in which molecules of the object are most oriented as well as in which the minimum microwave transmission intensity is exhibited, an m value obtained in such a case was represented as $m_0$. An m value obtained as my represents the value of the refractive index when the angle of rotation of the object is 90°. A segment orientation ratio SOR was calculated as $m_0/m_{90}$.

Film Thickness

Thicknesses of an obtained film were measured at intervals of 1 cm in the TD direction using a digital thickness meter (available from Mitutoyo Corporation), and the film thickness was determined as an average thicknesses of 10 points arbitrarily selected from a center portion and end portions.

Heat Resistance Test (Solder Heat Resistance)

Solder float test was carried in conformity with JIS C 5012 to examine solder heat resistance of the circuit board. The solder heat resistance was evaluated by observing a substrate sample that was subjected to solder float test in a solder bath of 290° C. for 60 seconds whether the substrate sample had at least one blister having an area of 100 μm×100 μm or wider by sight or using an optical microscopy (5 magnifications or higher).

Specifically, from a circuit board sample having a size of 30 cm square (30 cm×30 cm) were derived five circuit board samples each having a size of 5 cm square (5 cm×5 cm) by randomly cutting. Each of the five circuit board samples were subjected to the solder float test, and blister occurrence was observed by sight or using an optical microscopy (5 magnifications or higher). Where blister was not observed in all of the five cut samples, the originated circuit board sample was determined as good, i.e., showing solder heat resistance. Where blister was observed in any one of the five cut samples, the originated circuit board sample was determined as poor.

Interlayer Adhesion

A circuit board was press-cut into a thin-strip form with a width of 10 mm to obtain a test sample. After peeling an edge of the adhesion interface in the test sample, peel strength was measured in ambient temperature by peeling adherend and adhesive films from each other at a peeling angle of 90° and at a peeling rate of 5 cm per minute using "Digital Force Gauge" available from NIDEC-SHIMPO CORPORATION to obtain an average value of loads for a length of 5 cm. It should be noted that too-large fluctuated values in the beginning and ending of the measurement were not used for calculating the average.

Example 1

(1) Production of Adhesive LCP Film (Adhesive Film)

From a copolymerization product of p-hydroxybenzoic acid and 6-hydroxy-2-naphthoic acid (mole ratio: 73/27) was obtained a TLCP film having a melting point of 280° C. and a film thickness of 50 μm. The TLCP film had a moisture content of 400 ppm and an SOR of 1.02.

(2) Production of Unit Circuit Board (Adherend Film)

From a copolymerization product of p-hydroxybenzoic acid and 6-hydroxy-2-naphthoic acid (mole ratio: 73/27) was obtained a TLCP film having a melting point of 280° C. and a film thickness of 50 μm. The TLCP film was heat-treated under nitrogen atmosphere at 260° C. for 4 hours, and at 280° C. for another 2 hours to increase a melting point into 320° C. to obtain an adherend film. Onto each surface of the film, a rolled copper foil with a thickness of 12 μm and a predetermined surface roughness was set to be laminated using a continuous heat-pressing machine with a pair of rolls at a roll temperature of 300° C., a linear pressure of 100 kg/cm, and a line speed of 2 m/min to obtain a copper-clad laminate. The copper-clad laminate was processed to produce a unit circuit board having a strip line structure (the existing ratio of conductive material on the conductor circuit surface is less than 30%). The TLCP film in the unit circuit board had a moisture content of 400 ppm and an SOR of 1.02.

(3) Production of Multilayer Circuit Board

Figure 3A:
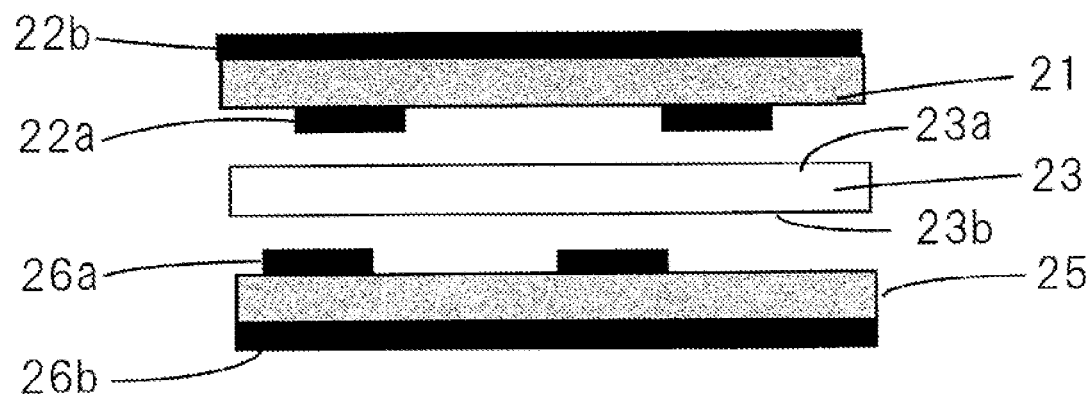
FIG. 3A is a schematic view for explaining a status before lamination as for each of the multilayer circuit boards produced in Examples 1 to 4.
Figure 3B:
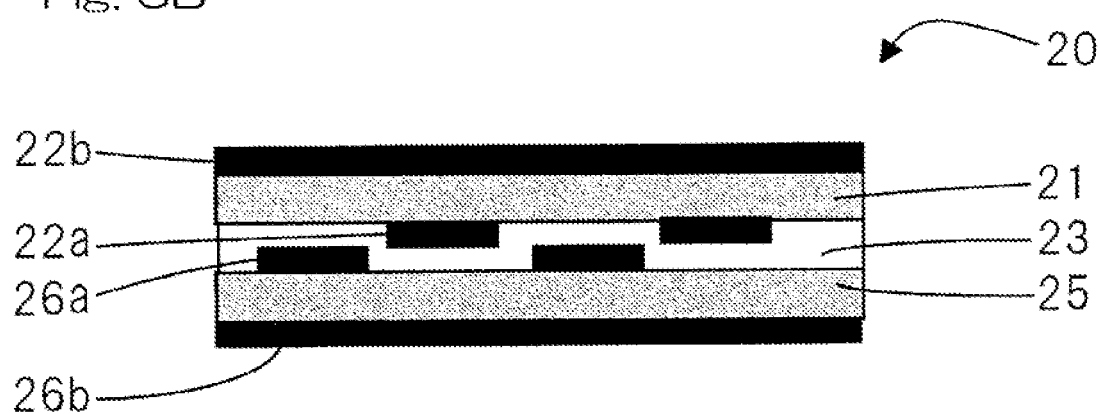
FIG. 3B is a schematic view for explaining a status after lamination as for each of the multilayer circuit boards produced in Examples 1 to 4.

The adhesive LCP film 23 obtained in the process (1) was used as a bonding sheet. As shown in the circuit board configuration in FIGS. 3A and 3B, the adhesive LCP film 23 was interposed between two sheets of the insulating substrates 21 and 25 to obtain a stacked material. The stacked material was placed (set) in a vacuum heat press apparatus. It should be noted that the insulating substrate 21 had a conductor circuit 22a and a conductor layer 22b on both surfaces, respectively, to configure a unit circuit board; and that the insulating substrate 25 had a conductor circuit 26a and a conductor layer 26b on both surfaces, respectively, to configure a unit circuit board. The surfaces 23a and 23b of the adhesive LCP film 23 covered the conductor circuits 22a and 26a, respectively.

Before set (stacked), the adhesive LCP film 23 and the insulating substrates 21 and 25 had surface states of relative intensities (%) each being a sum of relative peak areas of C—O and COO bond peaks in each of the XPS spectral profiles as shown in Table 7. Thereafter, the stacked material was subjected to pre-heating (degassing under vacuum at a vacuum degree of 1500 Pa or lower for 60 minutes) and then to thermo-compression bonded under vacuum at a vacuum degree of 1300 Pa and a compression pressure of 4 MPa at 300° C. for 30 minutes to be bonded with each other to obtain a circuit board having a configuration of unit circuit board/bonding sheet/unit circuit board. The obtained circuit board was evaluated in various physical properties. Table 7 shows obtained properties.

Example 2

Each of the surfaces to be adhered in the adhesive LCP film and the unit circuit boards obtained in Example 1 was subjected to UV-irradiation by irradiating 254 nm of ultraviolet ray at an irradiation amount of 400 mJ/cm$^2$ at a distance between the light source and the surface to be irradiated of 2 cm for 1.05 minutes using a UV-irradiation machine "UV-surface Treating Machine" available from SEN ENGENEERING CO., LTD.

Thus-obtained adhesive LCP film 23 was used as a bonding sheet. As shown in the circuit board configuration in FIGS. 3A and 3B, the adhesive LCP film 23 was interposed between two sheets of the insulating substrates 21 and 25 to obtain a stacked material. The stacked material was placed in a vacuum heat press apparatus. It should be noted that the insulating substrate 21 had a conductor circuit 22a and a conductor layer 22b on both surfaces, respectively, to configure a unit circuit board; and that the insulating substrate 25 had a conductor circuit 26a and a conductor layer 26b on both surfaces, respectively, to configure a unit circuit board. The surfaces 23a and 23b of the adhesive LCP film 23 covered the conductor circuits 22a and 26a, respectively.

Before set (stacked), the adhesive LCP film 23 and the insulating substrates 21 and 25 had surface states of relative intensities (%) each being a sum of relative peak areas of C—O and COO bond peaks in each of the XPS spectral profiles as shown in Table 7. Thereafter, the stacked materials were subjected to pre-heating (degassing under vacuum at a vacuum degree of 1500 Pa or lower for 60 minutes) and then to thermo-compression bonded under vacuum at a vacuum degree of 1300 Pa and a compression pressure of 4 MPa at 300° C. for 30 minutes to be bonded with each other to obtain a circuit board having a configuration of unit circuit board/bonding sheet/unit circuit board. The obtained circuit board was evaluated in various physical properties. Table 7 shows obtained properties.

Example 3

Before being placed in a vacuum heat press apparatus, the adhesive LCP film and the unit circuit boards obtained in Example 1 were subjected to degassing under heating so as to decrease moisture contents of them to be 200 ppm or lower. Except for subjecting them to the degassing, the same configuration was adopted with Example 1. It should be noted that degassing under heating was carried out by heating the adhesive films obtained in Example 1 at 120° C. for 60 minutes.

Thus-obtained adhesive LCP film 23 was used as a bonding sheet. As shown in the circuit board configuration in FIGS. 3A and 3B, the adhesive LCP film 23 was interposed between two sheets of the insulating substrates 21 and 25 to obtain a stacked material. The stacked material was placed in a vacuum heat press apparatus. It should be noted that the insulating substrate 21 had a conductor circuit 22a and a conductor layer 22b on both surfaces, respectively, to configure a unit circuit board; and that the insulating substrate 25 had a conductor circuit 26a and a conductor layer 26b on both surfaces, respectively, to configure a unit circuit board. The surfaces 23a and 23b of the adhesive LCP film covered the conductor circuits 22a and 26a, respectively.

Before set (stacked), the adhesive LCP film 23 and the insulating substrates 21 and 25 had surface states of relative intensities (%) each being a sum of relative peak areas of C—O and COO bond peaks in each of the XPS spectral profiles as shown in Table 7. Thereafter, the stacked materials were subjected to pre-heating (degassing under vacuum at a vacuum degree of 1500 Pa or lower for 60 minutes) and then to thermo-compression bonded under vacuum at a vacuum degree of 1300 Pa and a compression pressure of 4 MPa at 300° C. for 30 minutes to be bonded with each other to obtain a circuit board having a configuration of unit circuit board/bonding sheet/unit circuit board. The obtained circuit board was evaluated in various physical properties. Table 7 shows obtained properties.

Example 4

(1) Production of Adhesive LCP Polymer Film

From a copolymerization product of p-hydroxybenzoic acid and 6-hydroxy-2-naphthoic acid (mole ratio: 73/27) was obtained a TLCP film having a melting point of 280° C. and a film thickness of 50 μm. The TLCP film was heat-treated under nitrogen atmosphere at 260° C. for 4 hours, and at 280° C. for another 2 hours to increase a melting point into 320° C. The TLCP film had a moisture content of 400 ppm and an SOR of 1.02.

(2) Production of Multilayer Circuit Board

The adhesive LCP film 23 obtained in the above (1) was used as a bonding sheet. As shown in the circuit board configuration in FIGS. 3A and 3B, the adhesive LCP film 23 was interposed between two sheets of the insulating substrates 21 and 25 to obtain a stacked material. The stacked material was placed in a vacuum heat press apparatus. It should be noted that the insulating substrate 21 had a conductor circuit 22a and a conductor layer 22b on both surfaces, respectively, to configure a unit circuit board; and that the insulating substrate 25 had a conductor circuit 26a and a conductor layer 26b on both surfaces, respectively, to configure a unit circuit board. The surfaces 23a and 23b of the adhesive LCP film covered the conductor circuits 22a and 26a, respectively.

Before set (stacked), the adhesive LCP film 23 and the insulating substrates 21 and 25 had surface states of relative intensities (%) each being a sum of relative peak areas of C—O and COO bond peaks in each of the XPS spectral profiles as shown in Table 7. Thereafter, the stacked materials were subjected to pre-heating (degassing under vacuum at a vacuum degree of 1500 Pa or lower for 60 minutes) and then to thermo-compression bonded under vacuum at a vacuum degree of 1300 Pa and a compression pressure of 4 MPa at 300° C. for 30 minutes to be bonded with each other to obtain a circuit board having a configuration of unit circuit board/bonding sheet/unit circuit board. The obtained circuit board was evaluated in various physical properties. Table 7 shows obtained properties.

Example 5

Production of Multilayer Circuit Board

The adhesive LCP films and the unit circuit board obtained in the above (1) were used. The insulating substrate 11 was interposed between the adhesive films 13 as coverlays. As shown in the circuit board configuration in FIGS. 1A and 1B, the unit circuit board was provided with the insulating substrate 11 and the conductor circuits 12, 12 formed on the both surfaces, respectively, of the insulating substrate 11. The adhesive films 13*a* and 13*b* were overlaid on the conductor circuits 12, 12, respectively, so as to be placed in a vacuum heat press apparatus.

Before set (stacked), the adhesive LCP film 13 and the insulating substrate 11 had surface states of relative intensities (%) each being a sum of relative peak areas of C—O and COO bond peaks in the XPS spectral profiles as shown in Table 7. Thereafter, the stacked materials were subjected to pre-heating (degassing under vacuum at a vacuum degree of 1500 Pa or lower for 60 minutes) and then to thermocompression bonded under vacuum at a vacuum degree of 1300 Pa and a compression pressure of 4 MPa at 300° C. for 30 minutes to be bonded with each other to obtain a circuit board having a configuration of coverlay/unit circuit board/coverlay. The obtained circuit board was evaluated in various physical properties. Table 7 shows obtained properties.

Example 6

Except for omitting pre-heating process, a multilayer circuit board was produced in the same manner as Example 1. The obtained circuit board was evaluated in various physical properties. Table 7 shows obtained properties.

Examples 7 to 9

Except for changing the irradiating conditions (UV wave length, irradiation dose, distance between light source and irradiated surface, irradiation time) of UV-rays as shown below, UV-ray was irradiated onto each of the surfaces to be adhered in adhesive LCP film and unit circuit boards obtained in Example 2 so as to produce a multilayer circuit boards in the same manner as Example 2. The obtained circuit boards were evaluated in various physical properties. Table 7 shows obtained properties.

|  |  | UV wave length (nm) | Irradiation amount (kJ/m$^2$) | Irradiation distance (cm) | Irradiation period (min) |
|---|---|---|---|---|---|
| Ex. 7 | Adherend film | 254 | 400 | 2 | 0.8 |
|  | Adhesive film | 254 | 400 | 2 | 0.3 |
| Ex. 8 | Adherend film | 254 | 400 | 2 | 1 |
|  | Adhesive film | 254 | 400 | 2 | 0.1 |
| Ex. 9 | Adherend film | 254 | 400 | 2 | 1.4 |
|  | Adhesive film | 254 | 400 | 2 | 1.4 |

Comparative Example 1

Except for using the UV-irradiated film obtained in Example 2 as the adhesive LCP film 23, a circuit board was obtained in the same manner with Example 1. The obtained circuit board was evaluated in various physical properties. Table 7 shows obtained properties.

Comparative Example 2

Except for using the UV-irradiated films obtained in Example 2 as the insulating substrates 21, 25, a circuit board was obtained in the same manner with Example 1. The obtained circuit board was evaluated in various physical properties. Table 7 shows obtained properties.

Comparative Example 3

Except for using the UV-irradiated films obtained in Example 2 as the insulating substrates 21, 25, a circuit board was obtained in the same manner with Example 6. The obtained circuit board was evaluated in various physical properties. Table 7 shows obtained properties.

Comparative Example 4

Except for changing the irradiating conditions (UV wave length, irradiation dose, distance between light source and irradiated surface, irradiation time) of UV-rays as shown below, UV-ray was irradiated onto each of the surfaces to be adhered in adhesive LCP film and unit circuit boards obtained in Example 2 so as to produce a multilayer circuit boards in the same manner as Example 2. The obtained circuit boards were evaluated in various physical properties. Table 7 shows obtained properties.

|  |  | UV wave length (nm) | Irradiation amount (kJ/m$^2$) | Irradiation distance (cm) | Irradiation period (min) |
|---|---|---|---|---|---|
| Com. | Adherend film | 254 | 400 | 2 | 0.1 |
| Ex. 4 | Adhesive film | 254 | 400 | 2 | 1 |

TABLE 7

| | Adherend film | | | Adhesive film | | | | | | Circuit board | | |
|---|---|---|---|---|---|---|---|---|---|---|---|---|
| | Sum of relative peak areas X [C − O] + [COO](%) | Melting point (° C.) | Moisture content (ppm) | Sum of relative peak areas Y [C − O] + [COO](%) | X + Y | X − Y | Melting point (° C.) | Moisture content (ppm) | Pre-heat | Config-uration | Solder heat resis-tance | Interlayer adhesion (kN/m) |
| Ex. 1 | 19.6 | 320 | 400 | 19.6 | 39.2 | 0.0 | 280 | 400 | Yes | 20 | Good | 1.4 |
| Ex. 2 | 29.3 | 320 | 400 | 29.3 | 58.6 | 0.0 | 280 | 400 | Yes | 20 | Good | 0.7 |
| Ex. 3 | 19.6 | 320 | 200 | 19.6 | 39.2 | 0.0 | 280 | 200 | Yes | 20 | Good | 1.4 |
| Ex. 4 | 19.6 | 320 | 400 | 19.6 | 39.2 | 0.0 | 320 | 400 | Yes | 20 | Good | 1.1 |
| Ex. 5 | 19.6 | 320 | 400 | 19.6 | 39.2 | 0.0 | 280 | 400 | Yes | 10 | Good | 1.4 |
| Ex. 6 | 19.6 | 320 | 400 | 19.6 | 39.2 | 0.0 | 280 | 400 | No | 20 | Good | 0.8 |
| Ex. 7 | 26.7 | 320 | 400 | 22.2 | 48.9 | −4.5 | 280 | 400 | Yes | 20 | Good | 0.8 |
| Ex. 8 | 28.2 | 320 | 400 | 20.7 | 48.9 | −7.5 | 280 | 400 | Yes | 20 | Good | 0.6 |
| Ex. 9 | 30.56 | 320 | 400 | 30.56 | 61.12 | 0.0 | 280 | 400 | Yes | 20 | Good | 1.1 |
| Com. Ex. 1 | 19.6 | 320 | 400 | 29.3 | 48.9 | 9.7 | 280 | 400 | Yes | 20 | Poor | 0.65 |
| Com. Ex. 2 | 29.3 | 320 | 400 | 19.6 | 48.9 | −9.7 | 280 | 400 | Yes | 20 | Poor | 0.3 |

TABLE 7-continued

| | Adherend film | | | Adhesive film | | | | | | Circuit board | | |
|---|---|---|---|---|---|---|---|---|---|---|---|---|
| | Sum of relative peak areas X [C−O] + [COO](%) | Melting point (°C.) | Moisture content (ppm) | Sum of relative peak areas Y [C−O] + [COO](%) | X+Y | X−Y | Melting point (°C.) | Moisture content (ppm) | Pre-heat | Config-uration | Solder heat resis-tance | Interlayer adhesion (kN/m) |
| Com. Ex. 3 | 29.3 | 320 | 400 | 19.6 | 48.9 | −9.7 | 280 | 400 | No | 20 | Poor | 0.2 |
| Com. Ex. 4 | 20.2 | 320 | 400 | 28.7 | 48.9 | 8.5 | 280 | 400 | Yes | 20 | Poor | 0.4 |

As shown in Table 7, in Examples 1 and 3 to 6, where an appropriate combination between the relative intensity Y of the adhesive film and the relative intensity X of the adherend film was achieved by controlling the selection of the adhesive film and the adherend film to have specific ranges of X+Y and Y−X, even if the value of X+Y was less than 42, the laminated body of these films has a satisfactory interlayer adhesion, as well as good solder resistance. That is, these Examples reveal that where each of the adhesive films is selected so as to have a specific relationship with each of the adherend films, even without activation treatment, the selected adhesive films contribute to satisfactory interlayer adhesion as well as good solder heat resistance.

Example 5 shows that the similar effect can be obtained where the adhesive LCP films are used as coverlays.

In Examples 2 and 7 to 9, which are subjected to UV irradiation, where each of the adhesive films is controlled so as to have a specific relationship of X+Y and Y−X with each of the adherend films, the adhesive films contribute to satisfactory interlayer adhesion as well as good solder heat resistance.

Further, some Examples reveal that the interlayer adhesion is presumably further improved by degassing treatment of films such as pre-heat treatment or degassing under vacuum. For example, in comparison with Example 6 without degassing treatment, Example 1 that is subjected to pre-heat treatment and Example 3 that is subjected to degassing under vacuum show higher interlayer adhesion.

On the contrary, as shown in Comparative Examples 1 to 3, where only one of the adhesive and adherend films is UV-irradiated so as to be outside of the specific relationship of X+Y and Y−X defined in the present invention, the obtained circuit boards have unsatisfactory solder heat resistance. Further as shown in Comparative Example 4, even where both the adhesive and the adherend films were UV-irradiated, since Comparative Example 4 does not satisfy the specific relationship of X+Y and Y−X defined in the present invention, the obtained circuit board has unsatisfactory solder heat resistance.

More specifically, in Comparative Examples 1 to 4, at least one of the adhesive and adherend films satisfies that a sum of relative peak areas of C—O and COO bond peaks is 21% or more, and that a peak area ratio of C—O bond peak/COO bond peak is 1.5 or less. However, the obtained circuit boards are deteriorated in solder heat resistance. Further, Comparative Examples 2 to 4 show significantly deteriorated interlayer adhesion.

INDUSTRIAL APPLICABILITY

The circuit board according to the present invention can be used as substrates for various electrical and electronic products. In particular, since the LCP film has excellent dielectric characteristics at high frequency, the circuit board according to the present invention can be advantageously used as a high frequency circuit board or the like.

Although the present invention has been fully described in connection with the preferred embodiments thereof, those skilled in the art will readily conceive numerous changes and modifications within the framework of obviousness upon the reading of the specification herein presented of the present invention. Accordingly, such changes and modifications are to be construed as included therein.

What is claimed is:

1. A method for producing a thermoplastic liquid crystal polymer film, as an adhesive film, suitable to be thermobonded to a thermoplastic liquid crystal polymer film, as an adherend film, the method comprising:
    preparing a first thermoplastic liquid crystal polymer film, as the adherend film, and a second thermoplastic liquid crystal polymer film, as the adhesive film;
    subjecting each of first and second surface portions to be adhered of the first and second thermoplastic liquid crystal polymer films prepared to X-ray photoelectron spectroscopy (XPS) analysis so as to obtain an XPS spectral profile of the first and second surface portions;
    examining a relative intensity of each of the thermoplastic liquid crystal polymer films prepared, the relative intensity being calculated as a ratio of a sum of peak areas of C—O bond peak and COO bond peak relative to a total area of C is peaks in the XPS spectral profile, as a first relative intensity X in percent, for the adherend film, and a second relative intensity Y in percent, for the adhesive film; and
controlling, by activation treatment, the adhesive film to have the second relative intensity Y such that the first relative intensity and the second relative intensity Y satisfy formulae (1) and (2):

$$38 \leq X+Y \leq 65 \tag{1}$$

$$-8.0 \leq Y-X \leq 8.0 \tag{2}$$

wherein the method further comprises: copolymerizing and forming the adhesive film, after the copolymerizing, degassing the adhesive film before or after the controlling of the second relative intensity Y by degassing the second thermoplastic liquid crystal polymer film
   (i) under vacuum of 1500 Pa or lower for 30 minutes or more, or
   (ii) under heating at a temperature in a range of from 100 to 200° C., or
   (iii) under the vacuum (i) and under the heating (ii) simultaneously or separately.

2. The method of claim 1, wherein the controlling comprises:

treating the film with at least one activation treatment selected from the group consisting of ultraviolet (UV) ray irradiation, plasma irradiation, and corona discharge treatment.

3. The method of claim 1, wherein the degassing is carried out under vacuum of 1500 Pa or lower while heating at a temperature in a range of from 50° C. to 200° C.

4. The method of claim 1, wherein the thermoplastic liquid crystal polymer film as the adhesive film has a film thickness in a range of from 10 to 500 μm.

5. The method of claim 1, comprising the degassing (i) of the film under vacuum of 1500 Pa or lower for 30 minutes or more.

6. The method of claim 1, comprising the degassing (ii) of the film under heating at a temperature ranging from 100° C. to 200° C.

7. The method of claim 1, comprising the degassing (i) and (ii) separately.

8. The method of claim 1, comprising the degassing (i) and (ii) simultaneously.

9. The method of claim 1, wherein the controlling comprises treating the film with ultraviolet (UV) ray irradiation.

10. The method of claim 1, wherein the controlling comprises treating the film with plasma irradiation.

11. The method of claim 1, wherein the controlling comprises treating the film with corona discharge treatment.

\* \* \* \* \*